United States Patent
Sekiya

(10) Patent No.: US 7,738,261 B2
(45) Date of Patent: Jun. 15, 2010

(54) FUNCTIONAL DEVICE FABRICATION APPARATUS AND FUNCTIONAL DEVICE FABRICATED WITH THE SAME

(75) Inventor: Takuro Sekiya, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 138 days.

(21) Appl. No.: 11/941,363

(22) Filed: Nov. 16, 2007

(65) Prior Publication Data

US 2008/0117238 A1    May 22, 2008

(30) Foreign Application Priority Data

Nov. 21, 2006  (JP) .............................. 2006-314882
Aug. 17, 2007  (JP) .............................. 2007-213083

(51) Int. Cl.
  *H05K 7/02*  (2006.01)
  *H05K 1/00*  (2006.01)

(52) U.S. Cl. ...................... 361/812; 361/739; 361/810; 174/255; 174/258; 442/152; 442/153

(58) Field of Classification Search ................ 428/209; 174/255, 258; 361/739, 810, 812; 442/152, 442/153

See application file for complete search history.

(56) References Cited

U.S. PATENT DOCUMENTS

| | | | |
|---|---|---|---|
| 3,171,756 A * | 3/1965 | Marshali ...................... 428/137 |
| 3,298,030 A | 1/1967 | Lewis et al. |
| 3,596,275 A | 7/1971 | Sweet |
| 3,683,212 A | 8/1972 | Zoltan |
| 3,747,120 A | 7/1973 | Stemme |
| 3,946,398 A | 3/1976 | Kyser et al. |
| 6,835,889 B2 * | 12/2004 | Hiraoka et al. .............. 174/521 |
| 6,918,666 B2 * | 7/2005 | Sekiya ........................ 347/107 |
| 6,992,433 B2 | 1/2006 | Sekiya |
| 7,062,849 B2 * | 6/2006 | Ohashi et al. ................ 29/852 |
| 7,084,559 B2 | 8/2006 | Sekiya |
| 7,374,977 B2 * | 5/2008 | Yamazaki et al. ........... 438/149 |
| 7,380,690 B2 * | 6/2008 | Sekiya ........................ 222/594 |
| 2003/0211246 A1 | 11/2003 | Kydd et al. |
| 2004/0077112 A1 | 4/2004 | Elliott |

(Continued)

FOREIGN PATENT DOCUMENTS

JP    56-9429    3/1981

(Continued)

OTHER PUBLICATIONS

Jul. 15, 2009 European search report in connection with a counterpart European patent application No. 07 25 4435.

(Continued)

*Primary Examiner*—Cathy Lam
(74) *Attorney, Agent, or Firm*—Cooper & Dunham LLP

(57) ABSTRACT

A functional device fabrication apparatus is provided for forming a wiring pattern or an electronic device on a substrate using paper or paper-based material by depositing solid content of a solution on the substrate. The functional device fabrication apparatus includes a jet head. The jet head jets the solution including electronic function material onto the substrate as dot patterns. The jet head includes a device for dispensing a droplet of the solution from the jet head. A drive signal applied to the device is configured to cause the droplet jetted by the device to have a specific shape before impacting a face of the substrate.

9 Claims, 20 Drawing Sheets

U.S. PATENT DOCUMENTS

| | | |
|---|---|---|
| 2004/0247842 A1 | 12/2004 | Koyama et al. |
| 2006/0159838 A1 | 7/2006 | Kowalski et al. |
| 2007/0044589 A1 | 3/2007 | Sekiya |
| 2007/0098882 A1 | 5/2007 | Koyama et al. |
| 2008/0280033 A1 | 11/2008 | Yamazaki et al. |

FOREIGN PATENT DOCUMENTS

| | | |
|---|---|---|
| JP | 2000-126681 | 5/2000 |
| JP | 2001-319567 | 11/2001 |
| JP | 2002-134878 | 5/2002 |
| JP | 2005-183801 | 7/2005 |

OTHER PUBLICATIONS

Aug. 27, 2009 European search report in connection with a counterpart European patent application 07 25 4435.

* cited by examiner

FUNCTIONAL DEVICE FABRICATION APPARATUS AND FUNCTIONAL DEVICE FABRICATED WITH THE SAME

TECHNICAL FIELD

The present disclosure relates generally to an apparatus and method for fabricating a functional sheet having a wiring pattern or an electronic device by applying electronic function material on a substrate, and a functional sheet fabricated by such apparatus.

DESCRIPTION OF THE BACKGROUND ART

In recent years, various elements in a field of light emitting devices/media and light processing device/media using minute fine particles/ultra fine particles have been studied. In order to apply such fine particles to various elements, high density integration obtained by depositing films or layers that include fine particle material on a solid substrate becomes a key factor. For example, thin films formed of highly integrated fine particles have been reported.

Thin films of inorganic compounds having desirable orientation can be formed with known methods, such as a molecular beam epitaxy method (MBE), a cluster ion beam method, an ion beam irradiation vacuum deposition method, a chemical vapor deposition method (CVD), a physical vapor deposition method (PVD), and a liquid phase epitaxy method (LPE). Thin films of organic compounds can be formed with known methods, such as a Langmuir Blow jet method (LB method). In general, dot particles may be obtained by allowing materials sublimed in high vacuum with a vacuum apparatus (e.g., MBE method) to form particles on a solid substrate in a self-organized manner.

The foregoing methods, however, have difficulty in controlling space between dot particles or size distribution of dot particles, and require greater cost for obtaining desired dot particles.

In view of such drawback, a liquid jet methods that is, a technique of forming a film of a material including fine particles by using liquid jet head are being proposed. For example, in one related art, an emulsion including nanoparticles is coated on a solid substrate by an inkjet coating technique, to form a thin film formed of ultra fine particles (nanoparticles) on the solid substrate.

Other than such liquid jet method, some conventional known methods for fabricating a circuit board are described below:

(1) A method of forming a copper wiring pattern has been proposed in which the copper wiring pattern is formed where a copper-clad laminate is covered with resist, is then exposed to form a circuit pattern with a photolithographic method, is then dissolved to remove unexposed resist, and is then etched at its resist-removed portions.

(2) In addition, a method of forming a conductive pattern has been proposed in which the conductive pattern is formed where a ceramic substrate is applied with a conductive paste for printing a desired circuit pattern by using a screen printing technique, and is then thermally processed in a nonoxide atmosphere for sintering metal fine particles in the conductive paste.

(3) Further, a method of forming a copper wiring pattern has been proposed in which the copper wiring pattern is formed where an insulating substrate, being formed with a thin conductive layer by deposition of conductive metal, is covered with resist, is then exposed to form a circuit pattern with a photolithographic method, is then dissolved for removing unexposed resist, and is then etched at its resist-removed portions.

Nevertheless, the foregoing conventional known methods may not be suited for forming fine patterns. Therefore, a method of forming fine patterns employing inkjet techniques has been proposed. In one exemplary method, a wiring patterns or a circuit board is fabricated by an inkjet method, in which a circuit pattern is directly drawn onto a substrate by applying metal paste. This method may simplify a fabrication process of fine patterns, have no necessity of waste fluid disposal, and require less manufacturing cost.

Although various methods using inkjet method have been proposed as above mentioned, there remains a need for improved methods of applying inkjet techniques for forming various devices and substrate patterns.

BRIEF SUMMARY

In an aspect of the present disclosure, a functional device fabrication apparatus is provided for forming a wiring pattern or an electronic device on a substrate using paper or paper-based material by depositing solid content of a solution on the substrate. The functional device fabrication apparatus includes a first jet head. The first jet head jets the solution including electronic function material onto the substrate as dot patterns. The first jet head includes an electro-mechanical energy conversion element, configured to deform when applied with an electric energy, and deformation of the electro-mechanical energy conversion element is used to dispense a droplet of the solution from the first jet head. When the droplet is flying before impacting a face of the substrate, the droplet has a first substantially spherical shape or a second shape having a spherical portion and a pillar-like portion extending after the spherical portion, and the second shape having a length within three times of a diameter of the spherical portion. A drive signal applied to the electro-mechanical energy conversion element of the first jet head is configured to cause the first jet head to jet the droplet of the solution including electronic function material or equivalent solution, so that the f jetted droplet has the first shape or the second shape before impacting a face of the substrate.

In another aspect of the present disclosure, a functional device fabrication apparatus that includes a first jet head is provided wherein the first jet head includes a heating element configured to generate heat and the heat is used to grow a bubble in the solution, and the grown bubble is used to jet a droplet of the solution from the first jet head. When the jetted droplet is flying before impacting a face of the substrate, the droplet has a shape having a spherical portion and a pillar-like portion extending after the spherical portion, the droplet having a length of at least five times of a diameter of the spherical portion. A drive signal applied to the heating element of the first jet head is configured to cause the first jet head to jet the droplet of such shape.

In another aspect of the present disclosure, a functional sheet including a substrate and a dot pattern is provided. The substrate is made of paper or paper-based material, and the dot pattern is disposed at least on one face of the substrate by depositing solid content in a solution including electronic function material.

BRIEF DESCRIPTION OF THE DRAWINGS

A more complete appreciation of the subject matter of this disclosure and many of the attendant advantages and features thereof can be readily obtained and understood from the following detailed description with reference to the accompanying drawings, wherein.

Figure 1A:
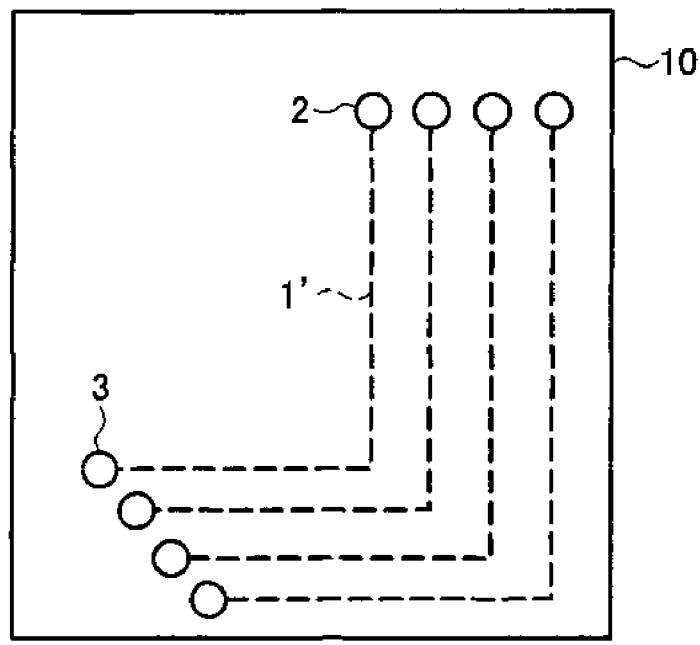
FIGS. 1A and 1B illustrate an example of a wiring pattern formed with a fabrication apparatus according to an exemplary embodiment.

The accompanying drawings are intended to depict exemplary embodiments of the present invention and should not be interpreted to limit the scope thereof. The accompanying drawings are not to be considered as drawn to scale unless explicitly noted, and identical or similar reference numerals designate identical or similar components throughout the several views.

DETAILED DESCRIPTION OF EXEMPLARY EMBODIMENTS

A description is now given of exemplary embodiments of the present invention. It should be noted that although such terms as first, second, etc. may be used herein to describe various elements, components, regions, layers and/or sections, it should be understood that such elements, components, regions, layers and/or sections are not limited thereby because such terms are relative, that is, used only to distinguish one element, component, region, layer or section from another region, layer or section. Thus, for example, a first element, component, region, layer or section discussed below could be termed a second element, component, region, layer or section without departing from the teachings of the present invention.

In addition, it should be noted that the terminology used herein is for the purpose of describing particular embodiments only and is not intended to be limiting of the present invention. Thus, for example, as used herein, the singular forms "a", "an" and "the" are intended to include the plural forms as well, unless the context clearly indicates otherwise. Moreover, the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Further, although in describing exemplary embodiments shown in the drawings, specific terminology is employed for the sake of clarity, the present disclosure is not limited to the specific terminology so selected and it is to be understood that each specific element includes all technical equivalents that operate in a similar manner.

Referring now to the drawings, an apparatus and a method for forming pattern on a substrate made of paper or paper-based material according to an exemplary embodiment is described with particular reference to the accompanying drawings. In this disclosure, "inkjet method," "jetting method" or the like are similarly used, and "dispense," "jet," "dispensing" "jetting" are also similarly used.

Figure 1B:
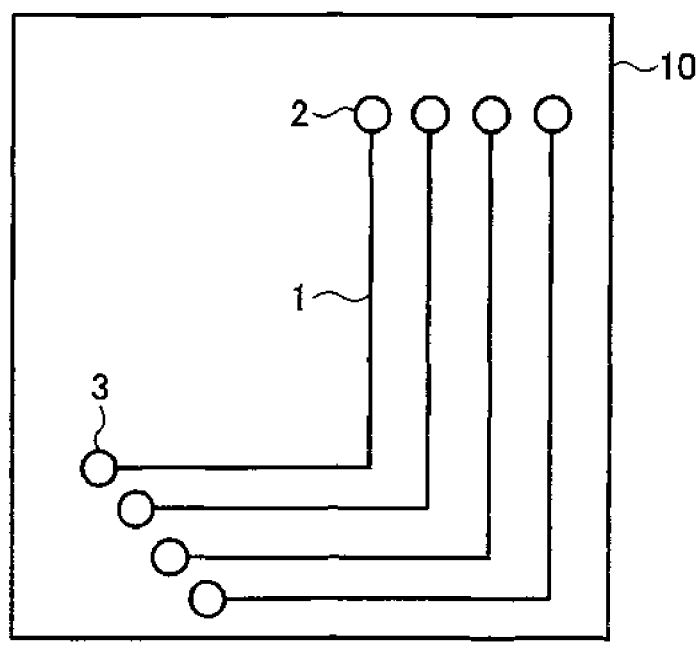

FIGS. 1A and 1B illustrate an example of a pattern formed on a substrate 10, made of paper or paper-based material, by using a liquid jetting method according to an exemplary embodiment. FIG. 1A shows a state that terminals 2 and 3 are formed on the substrate 10, in which a dotted portion 1' indicates an area where a wiring pattern is to be formed. FIG. 1B shows a state that a wiring pattern 1 is formed on the substrate 10 by dispensing a solution including electronic function material by the liquid jetting method.

In an exemplary embodiment, such liquid jetting method may be an inkjet method, which is used as a method for applying a solution containing electronic function material on a substrate. Hereinafter, a liquid jetting method or inkjet method may be referred as inkjet method. A detail description of such method is now given as follows.

Figure 2:
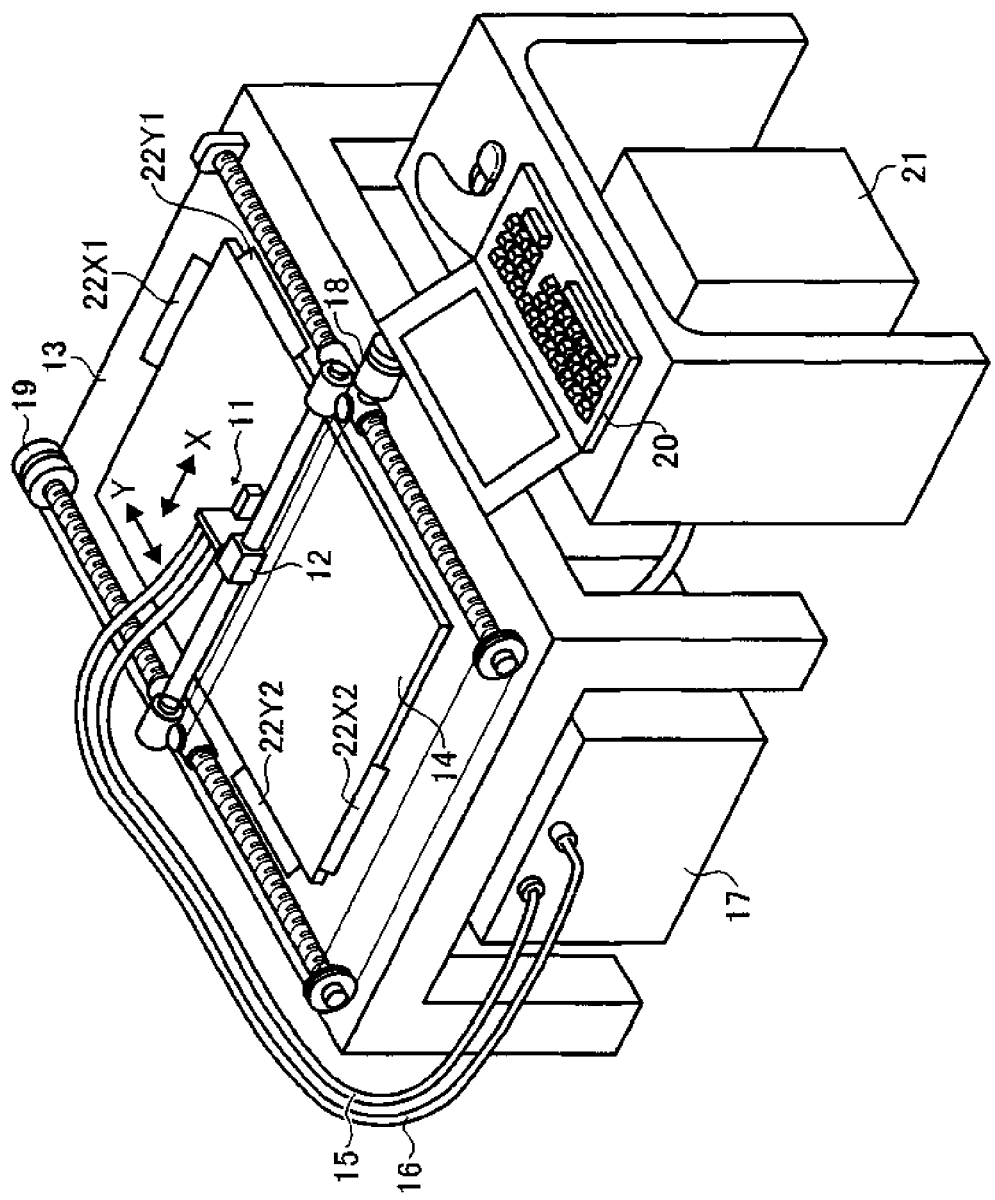
FIG. 2 illustrates a fabrication apparatus for fabricating a wiring pattern substrate or a device substrate according to an exemplary embodiment.

FIG. 2 illustrates a fabrication apparatus for forming a wiring pattern or an electronic device according to an exemplary embodiment. The fabrication apparatus includes a jet head unit 11, a carriage 12, a substrate holder 13, a substrate 14, a supply tube 15, a signal cable 16, a jet head control box (including a solution tank) 17, an X-direction scanning motor 18, a Y-direction scanning motor 19, a computer 20, a control box 21, and a substrate positioning/holding unit 22 (22X1, 22Y1, 22X2, 22Y2), for example.

The substrate 14 may be used as a substrate for forming a wiring pattern or an electronic device thereon, for example. The supply tube 15 is used to supply a solution including electronic function material from the solution tank to the jet head unit 11. The signal cable 16 is used to transmit signals from the jet head control box 17 to the jet head unit 11. The X-direction scanning motor 18 and the Y-direction scanning motor 19 are used to move the carriage 12 in. In such configuration, the jet head unit 11 is moved by scanning the carriage 12 in X/Y direction indicated in FIG. 2 when to jet a solution containing electronic function material to the substrate 14 disposed on the substrate holder 13.

Figure 3:
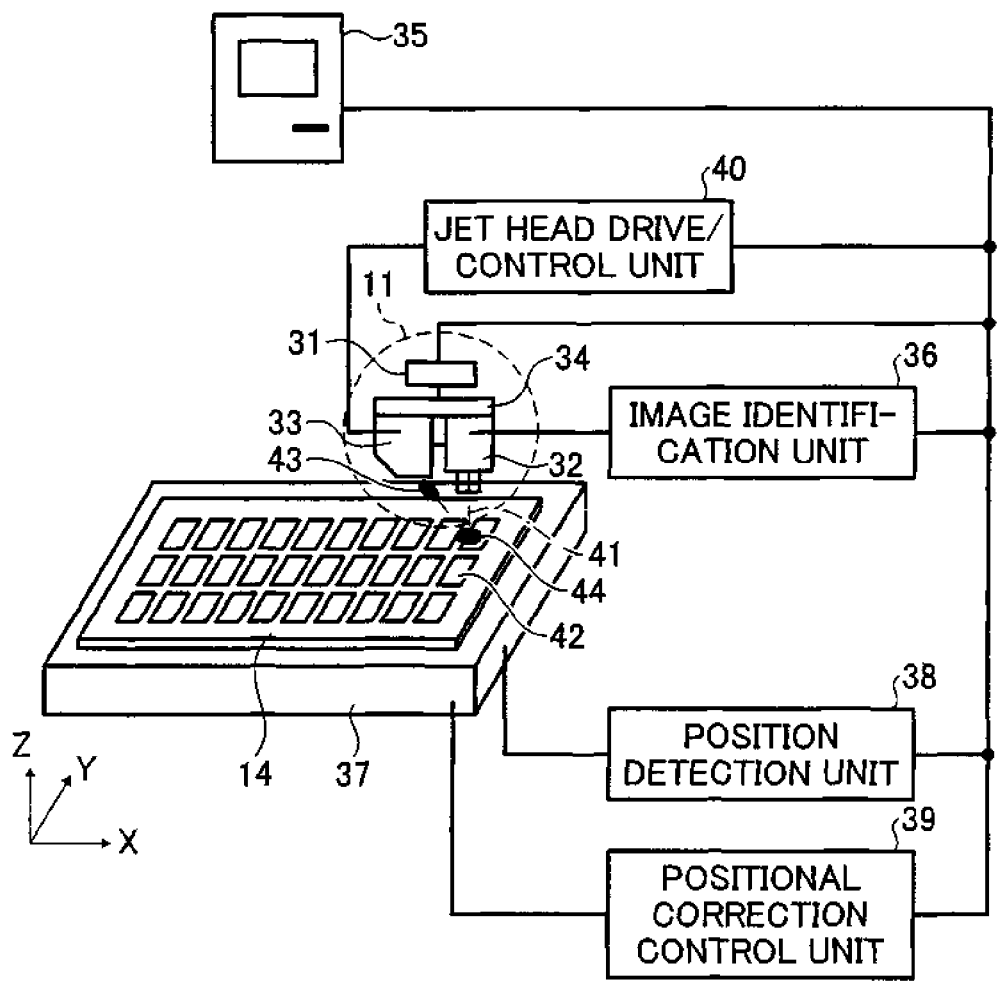
FIG. 3 illustrates another example of a fabrication apparatus for fabricating a wiring pattern substrate or a device substrate.

FIG. 3 illustrates a schematic configuration of another fabrication apparatus for fabricating a wiring pattern or an electronic device on a substrate with the inkjet method according to an exemplary embodiment. FIG. 4 illustrates a schematic configuration of a jetting head shown in FIG. 3.

The configuration of FIG. 3 differs from that of FIG. 2, wherein a wiring pattern or an electronic device is formed on the substrate 14 by moving the substrate 14 in the configuration of FIG. 3. As illustrated in FIGS. 3 and 4, another fabrication apparatus includes a jet head unit 11, a control computer 35, an image identification unit 36, a X/Y direction scan unit 37, an position detection unit 38, a positional correction control unit 39, and a jet head drive/control unit 40, for example. Further, the jet head unit 11 includes a head alignment control unit 31, an optical detection unit 32, a jet head 33, and a head alignment unit 34.

The jet head 33 (as droplet applicator) of the jet head unit 11 may employ any mechanism which can dispense a given amount of droplet. For example, the jet head 33 may preferably employ an inkjet mechanism, which is capable of dispensing droplet ranging from 0.1 pl (pico liter) to several hundreds of pl (pico liter).

In inkjet method, an electrical signal is applied to a piezoelectric vibrator so as to convert the electrical signal into mechanical vibration of the piezoelectric vibrator, which causes a droplet to be dispensed from a nozzle. Such method is generally known as a drop-on-demand method.

In another method, a droplet of a recording fluid containing a controlled amount of electrostatic charge is produced using a continuous vibration generating technique The produced droplet of the recording fluid flies between polarizing electrodes applied with a uniform electric field so as to reproduce images on a recording member. This is generally called the continuous flow method, or charge control method. Further, in another method, air bubbles are generated in fluid, and the bubbles act on the fluid so as to cause a droplet to be dispensed from a nozzle. This technique is generally called as thermal inkjet method or Bubble Jet (registered trademark) method.

A user can select any one of drop-on-demand method, continuous flow method, and thermal inkjet method in accordance with needs.

In an exemplary embodiment, the fabrication apparatus shown in FIG. 2 is used for fabricating a wiring pattern or an electronic device on a substrate, in which the substrate 14 is held and fixed at a given position by adjusting and determining a substrate holding position with the substrate positioning/holding unit 22. As shown in FIG. 2, the substrate positioning/holding unit 22 contacts each side of the substrate 14, and is capable of making fine adjustments in the X/Y-direction with an order of submicron meters, for example. Further, the substrate positioning/holding unit 22 is connected to the jet head control box 17, the computer 20, and the control box 21, thereby allowing for constant feedback of the substrate positioning information as well as fine adjustment information for substrate, droplet positioning information, and dispensing timing.

Further, in addition to the X/Y direction position adjustment mechanism, the fabrication apparatus for fabricating a wiring pattern or an electronic device on a substrate has a rotational position adjustment mechanism which is not shown in the drawing because it is positioned beneath the substrate 14.

A description is now given to a substrate used for fabricating a wiring pattern or an electronic device thereon.

In an exemplary embodiment, a wiring pattern or an electronic device is fabricated on a substrate made of paper or paper-based material. Hereinafter, paper or paper-based material may be collectively referred as paper substrate, or paper-based substrate.

As described later, a solution including electronic function material is applied onto the paper-based substrate to form a dot pattern to fabricate a wiring pattern or an electronic device on the paper-based substrate. Because such paper-based substrate has flexibility, such wiring pattern or electronic device formed on the paper-based substrate may have some flexibility (e.g., curving) while maintaining its functionality (e.g., circuit function). Further, such paper-based substrate may be advantageous of its lightweight, and portability in addition to the above-mentioned flexibility, by which a wiring pattern or an electronic device formed on the paper-based substrate may also be advantageous of its lightweight, and portability in addition to flexibility, which may increase a marketability of such wiring pattern substrate or electronic device substrate.

In an exemplary embodiment, a wiring pattern sheet, an electronic device, and an electronic device sheet may be defined as follows.

A wiring pattern sheet is an electric circuit pattern formed on a paper-based substrate. Such electric circuit pattern may be a wiring pattern, or a combination of electronic devices (e.g., transistor, resistance, capacitor) and wirings for connecting the electronic devices, for example.

An electronic device includes transistor, resistance, and capacitor, and display devices, for example. Further, an electronic device includes IC (integrated circuit) or LSI (large-scale integration), for example, which may integrate such electronic devices on one substrate.

An electronic device sheet is a sheet having a plurality of electronic devices thereon. Such electronic device sheet may be cut in chips for mass production of electronic devices.

A description is now given to a substrate used for manufacturing a wiring pattern sheet or electronic device sheet according to an exemplary embodiment.

In an exemplary embodiment, paper or paper-based material is used as substrate as above-mentioned.

In general, "paper" can be defined as an aggregation of plant fibers obtained by decomposing plant, such as grass, wood, bamboo or the like. For example, a paper can be made by suspending plant fibers in water, by filtering out plant fibers in water, and then by stacking plant fibers as a plane shape. Such plant fiber is a cellulose fiber, which is used as raw material to make paper (e.g., foreign paper, Japanese paper) by using paper technology.

In case of foreign paper, such cellulose fiber may be wood fiber having a length of 1 mm to 3 mm, a width of 20 μm to 40 μm, and a thickness of 3 μm to 6 μm, and such cellulose fibers may be stacked one on the other to form layers. For example, 10 to 100 cellulose fibers may be stacked one on the other to form layers of cellulose fibers. Such paper has a higher degree of porosity, smoothness, and an affinity.

In case of Japanese paper, such cellulose fiber may be bast fiber having a length of 3 mm to 7 mm and a width of 5 μm to 20 μm, which is relatively longer than the above-mentioned wood fiber and has a different molecular structure compared to the wood fiber. Japanese paper may be handmade or machine-made paper.

Figure 5:
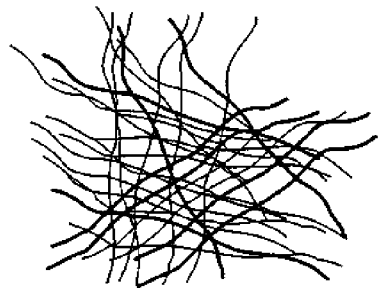
FIG. 5 illustrates a schematic view of cellulose fibers used as base material of paper.

FIG. 5 illustrates a schematic surface condition of paper, in which each line represents a cellulose fiber. A paper is made of cellulose fibers stacked one on the other and spaces formed among cellulose fibers.

Such paper having only cellulose fibers is used as a base paper for preparing commercially available paper. For example, filler particles, such as talc, clay, calcium carbonate, titanium dioxide, etc., having a particle diameter of 0.2 μm to 10 μm may be filled in space among cellulose fibers of base paper to increase opacity, whiteness, smoothness, and air permeability of commercially available paper.

Further, enamel paper may be prepared by applying a coating solution on paper, wherein such coating solution may be prepared by dispersing binder (e.g., latex, starch) and particles, such as kaolin ($Al_2O_3/2SiO_2/2H_2O$), calcium carbonate ($CaCO_3$), and satin white ($3CaO/Al_2O_3/3CaSO_4/31$ to $32H_2O$), etc., having a diameter of 0.5 μm to 1 μm in a solution, for example.

Further, commercially available paper may be roll paper for newspaper, non-coated print sheet, coated print sheet, office-use sheet, wrapping sheet, sanitary sheet, corrugated paper for cardboard, or the like, for example, but not limited to those.

Preferably, a substrate made of paper or paper-based material needs to have a given level of mechanical strength. As above mentioned, an electronic device sheet or a wiring pattern sheet according to an exemplary embodiment may be fabricated by the fabrication apparatus shown in FIG. 2, for example. When an electronic device sheet or a wiring pattern sheet is fabricated with the fabrication apparatus shown in FIG. 2, a substrate can be supported by the substrate holder 13, by which such substrate may not deform its shape. Accordingly, even if a substrate having a greater size is used, an electronic device sheet or a wiring pattern sheet may not deform when the electronic device sheet or wiring pattern sheet is fabricated in the fabrication apparatus shown in FIG. 2.

An electronic device or wiring pattern unit (hereinafter, "chip device") prepared from such electronic device sheet or wiring pattern sheet may be used in environment, which may vary depending on fields of application of devices.

If a chip device may deform its shape under a specific field environment, such deformation may cause to degrade functionality of chip device. Accordingly, a chip device may need to have a given level of mechanical strength. For example, a chip device needs to have a given mechanical strength to maintain its shape when no external force is applied to the chip device. If a chip device may deform its shape under no external force condition, such chip device may not have a practical use.

Specifically, a chip device that cannot support its self weight (i.e., deform its shape by self weight) may not have a practical use. In other words, a material that cannot support its shape with an effect of self weight is not preferable for a substrate. For example, tissue paper or cloth (e.g., handkerchief) having too small stiffness may not have a practical use as substrate.

However, if a deformation of chip device by its self weight may not cause to degrade functionality of chip device, such chip device may have a practical use. A description is now given to an allowable deformation level of chip device.

For example, a strain detection sensor, such as strain gauge or resistance strain meter, may be used to determine allowable deformation level of chip device. A strain detection sensor is used to determine a level of strain (or deformation) of an object by detecting a change of electric resistance of the object. If such strain (or deformation) of a substrate is detected by a strain detection sensor, such substrate cannot be used as substrate because a deformation, which may change an electric resistance of substrate, may cause to degrade functionality (e.g., electrical characteristic) of chip device.

Further, such allowable deformation level (or stiffness) of substrate can be evaluated based on a density of paper, for example.

As shown in Table 1, papers having different density were used to prepare chip devices having a size of 10×10 mm to 50×50 mm, in which ten chip device samples were prepared for each of papers having different density, and such chip device samples were evaluated whether a chip device had a good functionality.

TABLE 1

| Sample No. | Paper type | Density of paper |
|---|---|---|
| 1 | glassine paper | 1.10 g/cm$^3$ |
| 2 | India paper | 0.80 g/cm$^3$ |
| 3 | plain paper | 0.78 g/cm$^3$ |
| 4 | rice paper | 0.62 g/cm$^3$ |

TABLE 1-continued

| Sample No. | Paper type | Density of paper |
|---|---|---|
| 5 | news print paper | 0.57 g/cm$^3$ |
| 6 | impregnated paper A | 0.51 g/cm$^3$ |
| 7 | impregnated paper B | 0.40 g/cm$^3$ |
| 8 | handmade Japanese paper A | 0.18 g/cm$^3$ |
| 9 | handmade Japanese paper B | 0.09 g/cm$^3$ |

As shown in Table 1 sample Nos. 8 and 9 had a weaker mechanical strength and deformed easily. Accordingly, papers of sample Nos. 8 and 9 had no enough strength, and cannot be used as substrate. Other paper samples had enough strength, which can be used as substrate. Although sample No. 7 deforms its shape, "chip device" using sample No. 7 had a good functionality.

Based on results shown in Table 1, a substrate which can be used as a substrate may need to have a density of paper of 0.40 g/cm$^3$ or greater to set a preferable level of strength. A density of paper is a density used by paper manufacturers, wherein such density of paper is calculated by dividing a basis weight (i.e. gram weight of 1 m$^2$ of paper) with a thickness of paper.

Based on such results, it was confirmed that a paper may need a density of paper at 0.40 g/cm$^3$ or greater for "chip devices" having a size of 10×10 mm to 50×50 mm. Although the above described results for density of paper may not be automatically applied to other paper having a greater size, such as 1000×1000 mm, a practicability of chip device having greater size can be similarly determined by selecting density of paper and size, and by conducting electrical test for chip device for determining deformation level of chip device.

A stiffness, which is required for chip device, can be obtained by using paper or paper-based material having a good strength as above described.

In addition to such method, adding a protection member on chip device can increase strength of the chip device. For example, such protection member may be applied or coated on a front face or a back face of chip device.

Accordingly, a stiffness or strength of chip device can be further increased by using a strength-increased substrate (as paper or paper-based material) and a protection member applied or coated on a substrate, wherein such protection member may be used as protector of chip device and as mechanical strength enhancer.

Such protection member used as mechanical strength enhancer may be formed as resin layer on chip device by an inkjet method. For example, a resin solution can be applied on a front face or a back face of a substrate by an inkjet method. When resin is dried and fixed on the substrate as resin layer, such resin layer may increase a stiffness of substrate. Such protection member will be described later.

A description is further given to a paper or paper-based material used as substrate in an exemplary embodiment. Paper has microscopic concavity and convexity on its surface. Such concavity and convexity may be formed by spaces among cellulose fibers stacking one on the other and by particles added to paper, such as coating material, for example. Such microscopic concavity and convexity on paper surface may become an obstacle when to form a wiring patter or an electronic device having good quality because a solution including electronic function material is dispensed as dot pattern on a paper having concavity and convexity on its surface.

Such concavity and convexity of paper may be reduced or suppressed by using a coating material effectively, which is to be described later.

In an exemplary embodiment, a wiring pattern or an electronic device is formed on a substrate, such as paper or paper-based material, by directly applying a solution including electronic function material on a substrate.

When such wiring pattern substrate or electronic device substrate is used in environments (e.g., office, factory), a back face of substrate (i.e., a face having no wiring patterns or electronic devices) may be wet by moisture and such moisture may penetrate to a front face of the substrate having wiring patterns or electronic devices, and result into damaging of wiring patterns or electronic devices.

In view of such moisture effect, in an exemplary embodiment, a substrate may be protected from moisture as follows even if a back face of substrate is wet by moisture. For example, a water resistance material, such as resin film, which can block a penetration of moisture may be laminated on a back face of a substrate.

Such resin film can be laminated on a substrate as follows. For example, a substrate having laminated with a resin film may be used for fabricating a wiring pattern sheet or an electronic device sheet, or a resin film may be laminated on a back face of a substrate after forming a wiring pattern or an electronic device.

Such resin film may be made of any resin material, such as vinyl chloride resin and polypropylene resin, for example. Specifically, polyolefin, such as polypropylene resin, is known as environmentally friendly polymer, which is one preferable material for forming such resin film.

Further, instead of laminating a resin film on a back face of a substrate, a composite sheet having one layer of resin film can be manufactured as substrate for fabricating a wiring pattern sheet or electronic device sheet.

Further, a resin layer may be coated on a back face of a substrate by dispensing a resin solution to the back face of the substrate with an inkjet method or roller coating method, for example.

With such configuration for a substrate, a wiring pattern sheet or an electronic device sheet having water resistance can be fabricated with paper or paper-based material.

A description is now given to a preferable shape of a substrate used for forming a wiring pattern sheet or an electronic device sheet.

A shape of substrate made of paper or paper-based material, used for fabricating a wiring pattern substrate or an electronic device substrate may be shaped into a rectangular shape in view of fabricating substrates economically and of a practical usage of a final product (e.g., wiring pattern substrate or electronic device substrate). A rectangular shaped substrate has two vertical sides parallel to each other and two horizontal sides parallel to each other. A vertical side and a horizontal side intersect each other with a right angle.

In an exemplary embodiment, a group of electronic devices are arranged in a matrix on such rectangular substrate so that the two mutually orthogonal directions of this matrix are parallel to the directions of the vertical sides and the horizontal sides of the rectangular substrate, respectively. The reason for such arrangement (i.e., arraying the electronic devices in a matrix and making the vertical and horizontal sides of the substrate parallel with the two orthogonal directions of that matrix) is described as follows.

As illustrated in FIGS. 2 and 3, once the position of the jet head unit 11 with respect to the substrate 14 is determined, a complicated positional control may not be conducted. In other words, the jet head unit 11 dispenses a solution while moving in the X/Y directions relative to the substrate 14 and while keeping a given distance (or gap) from the substrate 14 when to form an electronic device.

The X-direction and Y-direction are two mutually orthogonal directions. Therefore, by setting the vertical side and the horizontal side of the substrate parallel to the X-direction and Y-direction when positioning the jet head unit 11 over the substrate, a group of electronic devices can be formed with a matrix arrangement on the substrate precisely because the two directions of the matrix array of electronic devices are set parallel to the sides of the substrate. In other words, by using a rectangular substrate and moving a substrate in the X and Y directions and by accurately positioning the substrate prior to dispensing droplets onto the substrate, a matrix of electronic devices can be formed with higher precision.

The rotational position adjustment mechanism mentioned earlier is now described. As above mentioned, in an exemplary embodiment, a matrix array of highly-precise electronic device can be formed by accurately positioning the substrate 14 before dispensing droplets onto the substrate 14, and by moving the substrate in the X and Y directions relatively without performing additional complicated control operations. When carrying out initial positioning of the substrate 14, there may be an offset (or positional shift) in the rotational direction of the Z-axis, perpendicular to the plane defined by the X and Y directions.

In order to compensate for such rotational offset of the substrate 14, the rotational position adjustment mechanism (not shown in the drawings since it is positioned beneath the substrate 14) is provided for the fabrication apparatus shown in FIG. 2. By compensating the rotational deviation and by correctly positioning the substrate 14 before dispensing droplets onto the substrate 14, a highly precise matrix array of electronic devices can be obtained simply by moving the substrate in the X and Y directions relatively.

In the above, the rotational position adjustment mechanism (not visible since positioned beneath the substrate 14) is described as a separate mechanism from the substrate positioning/holding unit 22 (22X1, 22Y1, 22X2, 22Y2) of FIG. 2.

However, the substrate positioning/holding unit 22 can be provided with a function of such rotational position adjustment mechanism. As above described, the substrate positioning/holding unit 22 contacts the sides of the substrate 14, and is capable of adjusting its position in the X-direction and Y-direction. In this case, an angle adjustment can be conducted with the substrate positioning/holding unit 22 by providing a configuration (e.g., screw adjusting method) for rotating the substrate positioning/holding unit 22.

Such rotational position information is transmitted to the jet head control box 17, the computer 20, and the control box 21, together with the X and Y direction positioning information and information for fine adjustment of the substrate. With such arrangement, droplet positioning information and dispense timing information can be constantly feed backed for fabricating a wiring pattern or an electronic device on the substrate.

Next, another configuration for positioning a substrate is described. As above described, the substrate positioning/holding unit 22 contacts the sides of the substrate 14, and the substrate positioning/holding unit 22 is used to adjust the position of the substrate 14 in the X-direction and Y-direction.

Instead of such method using the sides of the substrate 14, a stripe-shaped patterns extending in two perpendicular directions may be formed on the substrate 14 to adjust the position of the substrate 14 in the X/Y direction. Specifically, the stripe-shaped patterns extending in two perpendicular directions are formed on the substrate 14 using a known printing technique.

Such stripe-shaped patterns may be formed on a given area of the substrate, which may not interfere a functionality of the substrate. Further, instead of providing such stripe-shaped patterns used only for adjusting a position of the substrate, wiring patterns extending in the X-direction and Y direction (see FIG. 1B) or the device electrodes 42 (see FIGS. 3 and 4) may be used as a stripe-shaped patterns for adjusting a position of the substrate, for example. Such strip-shaped patterns can be detected by the optical detection unit 32 having a CCD (charge coupled device) camera and lens, and the detected information can be feed backed for the positional adjustment of the substrate.

Concerning the z direction perpendicular to the X-Y plane, the positional control in the Z direction may not be conducted once the positional relationship between the jet head unit 11 and the substrate 14 is determined before performing a dispense operation of solution. Specifically, the jet head unit 11 moves over the substrate 14 in the X/Y directions to dispense a solution containing electronic functional material while keeping a given distance (e.g., 1 mm to 3 mm) from the substrate 14.

If a positional control of the jet head unit 11 in the z direction is performed during the dispensing, a mechanism and control system for such control may need to be provided to an fabrication apparatus, which results into complicated control process for such mechanism. Further, if a positional adjustment is carried out in the Z direction during a dispensing operation of solution, a time period required for forming an electronic device on a substrate becomes longer, and may result into reduced productivity.

Although a positional control in the Z direction may not be performed during a dispensing operation of solution, a distance between the substrate 14 and the jet head unit 11 during the dispensing operation of droplets is controlled as follows.

Specifically, a flatness of the substrate 14 and a substrate supporter are enhanced and a carriage mechanism, which drives the jet head unit 11 over the substrate 14 in the X/Y directions, may be controlled precisely. With such configuration, the jet head unit 11 can be moved over the substrate 14 in the X/Y directions with a higher speed without performing a positional control in the z direction during the dispensing operation, by which a productivity of a wiring pattern sheet or a electronic device sheet can be enhanced. For example, a fluctuation of distance between the substrate 14 and the jet head unit 11 during the dispensing operation of droplets can be set within 2 mm or less in a case that a size of the substrate 14 is from 100×100 mm to 4000×4000 mm.

In general, a plane defined by the X/Y directions is held in a horizontal direction in a fabrication apparatus. However, if the substrate 14 has a smaller size, such as 500×500 mm or less, a plane defined by the X/Y directions may not be necessarily held in a horizontal direction in a fabrication apparatus but can be held in a given direction (e.g. slanted direction) which may be suitable for forming a wiring pattern sheet or a electronic device sheet.

Figure 4A:
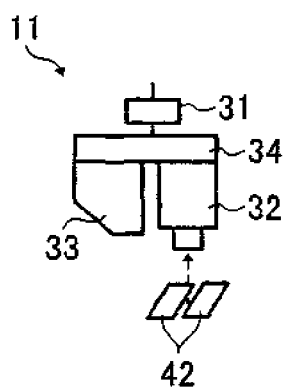
FIGS. 4A and 4B are schematic views of a jet head used for a fabrication apparatus, according to an exemplary embodiment.
Figure 4B:
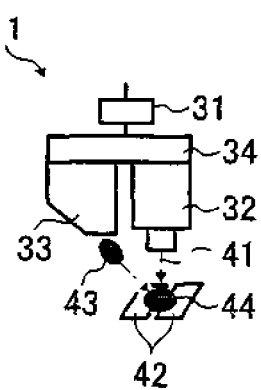

A description is now given to a configuration of the jet head unit 11 with reference to FIGS. 4A and 4B. As shown in FIGS. 4A and 4B, the optical detection unit 32 reads image information on the substrate 14. Such optical detection unit 32 is adjacent to the jet head 33 that dispenses the droplet 43. In a configuration shown in FIGS. 4A and 4B, an optical axis 41 and a focal point of the optical detection unit 32 and an impact point 44 of the droplet 43, dispensed from the jet head 33, are aligned in one direction.

A positional relationship between the optical detection unit 32 and the jet head 33 illustrated in FIG. 3 can be precisely adjusted with the head alignment unit 34 and the head alignment control unit 31. Further, the optical detection unit 32 includes a CCD (charge coupled device) camera and a lens, for example.

In a configuration shown in FIG. 3, the image identification unit 36 identifies image information detected by the optical detection unit 32. The image identification unit 36 converts image contrast into binary data, and calculates the center of balance of a specific portion of the binary contrast. Specifically, the high-resolution image recognition device VX-4210 manufactured by Keyence Corporation may be used. The position detection unit 38 provides position information on the substrate 14 for the image information obtained with the image identification mechanism 36. Such position information may be obtained by using a measurement unit, such as linear encoder, furnished in the X/Y direction scan unit 37. The positional correction control unit 39 performs positional correction for the substrate 14 by adjusting a movement of the X/Y direction scan unit 37 based on the positional information of the substrate 14 detected by the position detection unit 38 and image information detected by the optical detection unit 32. The jet head 33 is driven by the jet head control/drive mechanism 40, whereby the droplet is applied onto the substrate 14. Each of the above described control process is controlled by the control computer 35. Although a droplet shown in FIG. 4B is jetted diagonally onto a surface of a substrate for the purpose of showing the optical detection unit 32 and the jet head 33 clearly, a droplet can be jetted to a substrate from a substantially vertical direction with respect to a surface of a substrate in actual usage.

In an exemplary embodiment, the jet head unit 11 may be fixed at a given position and the substrate 14 may be moved under the jet head unit 11 with a movement of the X/Y direction scan unit 37 as illustrated in FIG. 3, or the substrate 10 may be fixed at a given position and the jet head unit 11 may be moved over the substrate 10 in the X/Y directions as illustrated in FIG. 2.

For example, in case of manufacturing a mid-sized substrates, such as 200×200 mm, to a large-sized substrates, such as 2000×2000 mm or greater, a configuration fixing the substrate 14 at a given position and moving the jet head unit 11 over the substrate 14 in the two orthogonal X and Y directions is preferable for dispensing droplets of a solution onto the substrate 14 in the X/Y direction.

If a substrate size is 200×200 mm or smaller, a jet head unit having multi-nozzles and a head length of 200 mm can be designed for dispensing droplets on such substrate. Because such jet head unit can cover a substrate length of 200 mm, such jet head unit may be moved over the substrate in only one direction (e.g., X direction) instead of moving in two orthogonal directions (e.g., X/Y directions) when to dispense droplets to the substrate. Accordingly, such arrangement may enhance productivity for mass production of wiring pattern sheet or electronic device sheet.

On one hand, if a substrate size exceeds 200×200 mm, it is difficult to manufacture a jet head unit having multi-nozzles which can cover a whole width of substrate from the viewpoint of cost and technical aspect. In this case, the jet head unit 11 which can be moved in the two orthogonal X and Y directions for dispensing droplets of solution is preferably used.

In general, a wiring pattern substrate or electronic device substrate having a smaller size, such as 200×200 mm, may be manufactured by cutting a large substrate, such as 400×400 mm and 2000×2000 mm or greater, having formed electronic devices thereon, into pieces. Accordingly, it is preferable to use the jet head unit 11, which may move in the two orthogonal X and Y directions to dispense solution droplets onto predetermined positions on a substrate.

A solution containing electronic function material may be prepared by dispersing conductive fine particles in a solution, and such solution is dispensed as droplet 43. For example, solutions including metal fine particles, such as Au, Pt, Ag, Cu, Ni, Cr, Rh, Pd, Zn, Co, Mo, Ru, W, Os, Ir, Fe, Mn, Ge, Sn, Ga, and/or In, are preferably used, or solutions including fine particles of metal oxide of such metals are preferably used.

Particularly, a fine circuit pattern, which has lower electric resistance and higher anti-corrosion, can be obtained by employing metal fine particles, such as Au, Ag, and Cu.

Such solutions containing conductive fine particles may be prepared as an aqueous solution and an oil solution.

For example, an aqueous solution, which includes water as a dispersant and minute conductive fine particles dispersed therein, may be prepared as below.

First, a water soluble polymer is dissolved in a metal ion aqueous solution (e.g. gold chloride, silver nitrate) and added with alkanolamine, such as dimethylaminoethanol, while being agitated. The solution is subjected to reduction of metal ions for several tens of seconds to several minutes, and metal fine particles having an average diameter of 0.5 µm (500 nm) or less is deposited. Then, chlorine ions or nitrate ions are removed by an ultrafiltration membrane, and then subjected to concentration/drying to obtain a solution containing concentrated conductive fine particles. The solution containing concentrated conductive fine particles may be effectively dissolved/mixed with water, alcoholic solution, or a binder used for a sol-gel process (e.g., tetraethoxysilane, triethoxysilane).

Further, an oil solution, which includes oil as a dispersant and minute conductive fine particles dispersed therein, may be prepared as below.

First, an oil soluble polymer is dissolved in a water miscible organic solvent (e.g. acetone) and mixed with metal ion aqueous solution. Although this mixture is a heterogeneous system, metal fine particles are extracted toward an oil phase in a manner dispersed in the polymer when alkanolamine is added while agitating the mixture. By concentrating/drying the mixture, a solution containing concentrated conductive fine particles can be obtained. The solution containing concentrated conductive fine particles can be effectively dissolved/mixed with a solvent, such as an aromatic compound, a ketone compound, or an ester compound, or a resin, such as polyester resin, epoxy resin, acryl resin, or polyurethane resin, for example.

Although the density of conductive fine particles in such solution may be a maximum of 80% by weight, the solution containing conductive fine particles is suitably diluted according to the purpose for use.

In the solution containing conductive fine particles, the conductive fine particles included therein is, typically, 2% to 50% by weight, the surfactant and resin included therein is 0.3% to 30% by weight, and the viscosity thereof is 3 to 30 centipoise, for example.

By using any one of the above-mentioned materials, in an exemplary embodiment, wiring patterns and electronic devices are formed by vaporizing (evaporating) volatile component in the solution so as to deposit solid content on a substrate. Such solid content may become wiring patterns or electronic devices on the substrate, and the solvent (volatile component) is used as a vehicle for dispensing the above-mentioned solution with inkjet method.

Further, a solution dispensed as droplet 43 may be include, for example, any one of a I-VII group semiconductor compound, such as CuCl, a II-VI group semiconductor compound, such as CdS, CdSe, etc., a III-V group semiconductor compound, such as InAs, a semiconductor crystal of a IV group, a metal oxide, such as $TiO_2$, SiO, $SiO_2$, etc., an inorganic compound, such as a fluorescent material, fullerene, dendrimer, etc., and an organic compound, such as phthalocyanine, azo compound, or a solution including nanoparticles of composite materials of the aforementioned materials.

The nanoparticles, which can be used in an exemplary embodiment, typically have a particle diameter of 0.0001 μm to 0.2 μm (0.1 nm to 200 nm) and more preferably a particle diameter of 0.0001 μm to 0.05 μm (0.1 nm to 50 nm). More particularly, the particle diameter is determined by taking into consideration some factors such as stability of dispersion of fine particles in a prepared solution, possibility of clogging during dispensing (or jetting), and surface roughness of substrate, for example.

It is to be noted that the surface of such nanoparticles may be subjected to chemical or physical processing, or an additive, such as surfactant, dispersion stabilizing agent, or antioxidant, may also be added within a scope of the present invention. The nanoparticles may be synthesized with, for example, a colloid chemistry method, such as a reversed micelle method or a hot THORP (thermal oxide reprocessing plant) method.

In an exemplary embodiment, a solution containing nanoparticles is preferably a dispersion liquid, in which the nanoparticles are dispersed in an emulsion (O/W emulsion) where a continuous phase thereof is an aqueous phase and a dispersed phase thereof is an oil phase.

Although such aqueous phase is mainly water, a water soluble organic solvent may be added to the water. As for the water soluble organic solvent, there are, for example, ethyleneglycol, propylene glycol, butylene glycol, diethylene glycol, triethylene glycol, polyethylene glycol (#200, #400), glycerin, alkylether of the aforementioned glycol, N-methylpyrrolidone, 1,3 dimethylimidazolinone, thiodiglycol, 2-pyrrolidone, sulfolane, dimethylsulfoxide, diethanolamine, triethanolamine, ethanol, and isopropanol. The amount of the water soluble organic solvent used in the aqueous dispersion medium is preferably 30% or less by weight, and more preferably 20% by weight.

Although a range of the amount of nanoparticles included in the dispersion liquid differs depending on types of film or layer to be formed on a substrate, alignment of particles, and/or the thickness of the desired film (layer), it is preferably 0.01% to 15% by weight, and more preferably 0.05% to 10% by weight. If an amount of nanoparticle is too small, a wiring pattern substrate or an electronic device substrate may not have enough level of functionality, and if an amount of nanoparticle is too large, jetting stability cannot be obtained when dispensing or jetting droplets with an inkjet method.

Further, it is preferable to include a surfactant and a solvent for dispersing nanoparticles in the dispersion liquid of the solution containing nanoparticles. As for the surfactant, there are, for example, anion surfactant (e.g., sodium dodecyl sulfonate, dodecylbenzene sulfonic acid natrium, lauric acid natrium, ammonium salt of polyoxythelenealkylethersulfate), and nonionic surfactant (e.g., polyoxyethylene alkylether, polyoxyethylene alkylester, polyoxyethylene soribitan fatty acid ester, polyoxyethylene alkylphenyl ether, polyoxyethylene alkylamine, polyoxyethylene alkylamide). Such agents may be used independently or as a mixture of two or more kinds.

A range of an amount of the surfactant in the entire solution is typically 0.1% to 30% by weight, and more preferably 5% to 20% by weight. If an amount of the surfactant is too small compared to such range, a water-oil separation in the aqueous dispersing liquid may occur, by which a pattern may not be formed or coated evenly on a substrate when droplets are dispensed. On the other hand, if an amount of the surfactant is too large compared to such range, the viscosity in the aqueous dispersing liquid may become too high, which may degrade droplet dispensing performance.

As for the solvent for dispersing nanoparticles, there are, for example, volatile liquids of toluene, hexane, pyridine, chloroform. A range of an amount of the solvent for dispersing nanoparticles is approximately 0.1% to 20% by weight, and more preferably 1% to 10% by weight. If an amount of the solvent for dispersing nanoparticles is too small compared to such range, the amount of ultra fine particles that can be included in the aqueous dispersing liquid becomes small. On the other hand, if an amount of solvent for dispersing nanoparticles is too large compared to such range, a water-oil separation in the aqueous dispersing liquid may occur.

Further, an organic compound may be dissolved in the dispersing liquid. As for the organic compound, there are, for example, trioctylphosphinoxide (TOPO), thiophenol, photochromic compound (spiropyrane, fulgide), a charge transfer type complex, and an electron accepting compound, in which the organic compound is preferably solid at room temperature. In this case, an amount of organic compound in the dispersing liquid with respect to the nanoparticles is {fraction (1/10000)} or more by weight, and more preferably approximately {fraction (1/1000)} to 10 times by weight.

It is to be noted that an additive, such as surfactant, dispersion stabilizing agent, or antioxidant, polymer, or a material that gelates in a coating/drying process may be added to the suspension within a scope of the present invention.

The above-described solution containing nanoparticles is jetted onto a substrate with an inkjet method and dried to form a wiring pattern or an electronic device on a substrate.

In an exemplary embodiment, the drying is conducted, for example, by air-drying in atmospheric pressure under a temperature of −20 to 120 degrees Celsius (more preferably, approximately 0 to 80 degrees Celsius) for 1 hour or more (more preferably, 3 hours or more), and then drying under depressurized condition may be conducted according to necessity. Such depressurized condition may be $1\times10^5$ Pa or less, and more preferably approximately $1\times10^4$ Pa or less. Further, such drying under depressurized condition may be typically conducted at a temperature of −20 to 110 degrees Celsius, and more preferably at temperature of approximately 0 to 70 degrees Celsius. Further, the time for drying under depressurized condition is approximately 1 to 24 hours.

Although a thickness of thin film of nanoparticles obtained by the aforementioned method is not restricted in any particular value, such thickness of thin film usually ranges from a diameter of a nanoparticle to 1 mm, and more preferably approximately a diameter of a nanoparticle to 100 μm. Further, it is preferable for the nanoparticles in the thin nanoparticle film to be disposed in a manner exceeding a certain density. Accordingly, an average space (distance) among nanoparticles in the nanoparticle aggregate is typically no more than 10 times of the particle diameter of nanoparticles, and more preferably no more than 2 times of the particle diameter of nanoparticles. If the average space among particles is too large, nanoparticles are unable to provide a collective function.

Further, a solution dispensed as droplet 43 may be a solution including organic semiconductor material. For example, such organic semiconductor material may be n conjugated material, which may be polypyrrole, such as polypyrrole, poly(N-substituent pyrrole), poly(3-substituent pyrrole), poly(3,4-double substituent pyrrole); polythiophene, such as polythiophene, poly(3-substituent thiophene), poly(3,4-doublesubstituent thiophene), polybenzothiophene; polyisothianaphthenen, such as polyisothianaphthenen; polychenylenevinylene, such as polychenylenevinylene; poly(p-phenylenevinylene), such as poly (p-phenylenevinylene); polyaniline, such as polyaniline, poly(N-substituent aniline), poly(3-substituent aniline), poly(2,3-substituent aniline); polyacetylene such as polyacetylene; polydiacetylene, such as polydiacetylene; polyazulene, such as polyazulene; polypyrene such as polypyrene; polycarbazole, such as polycarbazole, poly(N-substituent carbazole); polyselenophene, such as polyselenophene; polyfuran, such as polyfuran, polybenzofuran; poly(p-phenylene), such as poly(p-phenylene); polyindole, such as polyindole; polypyridazine, such as polypyridazine; polyacene, such as naphthacene, pentacene, hexacene, heptacene, dibenzopentacene, tetrabenzopentacene, pyrene, dibenzopyrene, chrysene, perylene, coronene, terrylene, ovalene, quaterrylene, circumanthracene, a derivative of polyacene, such as triphenodioxazine, triphenodithiazine, hexacene-6,15-quinone prepared by substituting carbon atom of polyacene with an atom of N, S, O, or functional group, such as carbonyl group; and a polymer, such as polyvinyl carbazole, polyphenylenesulfide, polyvinylenesulfide.

Further, a solution dispensed as droplet 43 may be made of oligomer having repeating units. For example, thiophene consisting of six monomer, such as α-sexythiophene, α,ω-dihexyl-α-sexythiophene, α,ω-bis(3-butoxypropyl)-α-sexythiophene, and styrylbenzene derivative, may be used.

Further, a solution dispensed as droplet 43 may be made of a metal phthalocyanine, such as copper phthalocyanine, fluorine substituted copper phthalocyanine; naphthalene tetracarboxylic acid diimide, such as naphthalene 1,4,5,8-tetracarboxylic acid diimide, N,N'-bis(4-trifluoromethylbenzyl) naphthalene 1,4,5,8-tetracarboxylic acid diimide; N,N'-bis(1H,1H-perfluorooctyl), N,N'-bis(1H,1H-perfluorobutyl), N,N'-dioctylnaphthalene 1,4,5,8-tetracarboxylic acid diimide derivative, naphthalene 2,3,6,7-tetracarboxylic acid diimide, and condensed ring tetracarboxylic acid diimide, such as anthracene tetracarboxylic acid diimide including anthracene 2,3,6,7-tetracarboxylic acid diimide; fullerene, such as C60, C70, C76, C78, C84; carbon nanotube, such as SWNT (single-walled carbon nanotube); and dye compound, such as merocyanine dye, hemicyanine dye, for example.

As for such n conjugated material, following compounds are preferably used: an oligomer having at least two of thiophene, vinylene, chenylenevinylene, phenylenevinylene, p-phenylene, and derivative substitution thereof as repeating unit and having 4 to 10 repeating units of these compounds; a polymer having 20 repeating units or more of these compounds; aromatic compound having condensed multiple-ring; fullerene; tetracarboxylic acid diimide having condensed ring; and metal phthalocyanine, for example.

The other organic semiconductor material that can be used for the droplet 43 may be organic molecule complex, such as tetrathiafulvalene (TTF)-tetracyanoquinodimethane (TCNQ) complex, bisethylenetetrathiafulvalene (BEDTTTF)-perchloric acid complex, BEDTTTF-iodine complex, and TCNQ-iodine complex. Further, a solution dispensed as droplet 43 may be σ conjugated polymer, such as polysilane, polygermane, for example.

An organic semiconductor material, mainly composed of polymer having a repeating unit shown as general formula (1), is preferably used in an exemplary embodiment. Such organic semiconductor material and a synthetic method thereof are described.

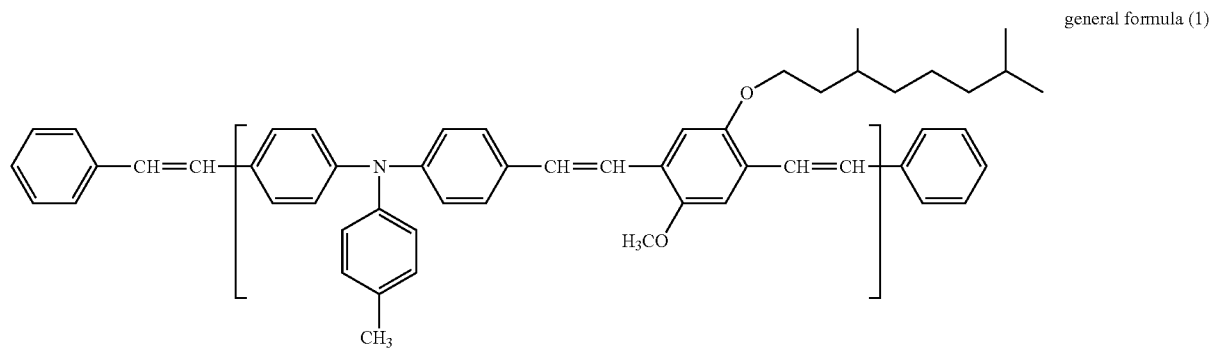

general formula (1)

For example, carbonyl compound shown as general formula (2) and phosphorus compound shown as general formula (3) are reacted to obtain polymer having a plurality of repeating units including carbon-carbon double bond shown as general formula (4).

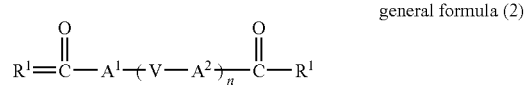

general formula (2)

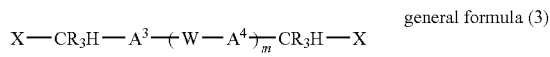

general formula (3)

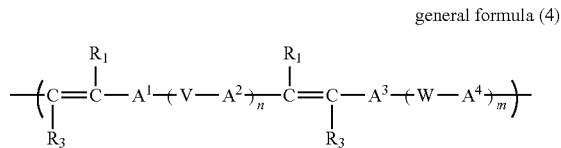

general formula (4)

In general formula (2), A1 and A2 represent monocyclic or polycyclic of allylene group or hetero allylene group, which is substituted or not-substituted; R1 represents hydrogen, substituted or not-substituted alkyl group, and substituted or not-substituted aryl group; V represents —O—, —S—, NR2-

(R2 represents monocyclic or polycyclic allylene group, which is substituted or not-substituted, or monocyclic or polycyclic hetero allylene group, which is substituted or not-substituted), and n represents more than zero (n≧0).

In general formula (3), A3 and A4 represent monocyclic or polycyclic of allylene group or hetero allylene group, which is substituted or not-substituted; R3 represents hydrogen, substituted or not-substituted alkyl, aryl, or heteroaryl group; W represents —O—, —S—, —NR4- (R4 represents monocyclic or polycyclic allylene group, which is substituted or not-substituted, or monocyclic or polycyclic hetero allylene group, which is substituted or not-substituted); m represents more than zero (m≧0); X represents PO(OR5)2 (R5 represents lower alkyl group) or P(R6)3+Y— (R6 represents substituted or not-substituted aryl group, or substituted or not-substituted alkyl group); and Y represents halogen atom.

Although base compounds, which can be dissolved in non-aqueous solvent uniformly, can be used for preparing an organic semiconductor material, preferably, a base compound, such as metal alkoxide, metal hydride, organic lithium compound, or the like, is used in view of alkalinity and formation of phosphonatecarbanion.

For example, potassium t-butoxide, sodium t-butoxide, lithium t-butoxide, potassium 2-methyl-2-butoxide, sodium 2-methyl-2-butoxide, sodium methoxide, sodium ethoxide, potassium ethoxide, potassium methoxide, sodium hydride, potassium hydride, methyllithium, ethyllithium, propyllithium, n-butyllithium, s-butyllithium, t-butyllithium, phenyllithium, lithium amide, and lithium diisopropylamide can be used.

A solvent for dissolving a base compound may need to dissolve the base compound as a stable solution, and to have a good solubility of the base compound. Further, such solvent may need a property, which may not cause a degradation of solubility of a high-molecular weight compound in a reaction solvent, in which a high-molecular weight compound is formed, and such solvent may need to dissolve a resultant high-molecular weight compound effectively. Such solvent may be selected from alcohol, ether, amine, carbon hydride solvent or the like depending on property of a base compound and a high-molecular weight compound.

Examples of solution having a base compound and a solvent solving the base compound uniformly are: sodium methoxide/methanol solution, sodium ethoxide/ethanol solution, potassium t-butoxide/2-propanol solution, potassium t-butoxide/2-methyl-2-propanol solution, potassium t-butoxide/tetrahydrofuran solution, potassium t-butoxide/dioxane solution, n-butyllithium/hexane solution, methyllithium/ether solution, lithium t-butoxide/tetrahydrofuran solution, lithium diisopropylamide/cyclohexane solution, potassium bistrimethylsilylamide/toluene solution, or the like, for example. Some of such solutions are commercially available.

From a viewpoint of mild reaction condition and easiness of handling, metal alkoxide solution is preferably used. From a viewpoint of solubility of resultant polymer, easiness of handling, reaction rate efficiency, metal t-butoxide ether solution is more preferably used, and potassium t-butoxide tetrahydrofuran solution is further preferably used.

A solution having same amount of phosphorus compound and aldehyde compound in terms of stoichiometric quantities may be mixed with a base compound solution having a base compound of two times or more of mole amount of phosphorus compound and aldehyde compound for polymerization reaction, by which a high-molecular weight polymer having a smaller range of molecular weight distribution may be preferably obtained.

Although an amount of base compound may be set equal to an amount of phosphorus compound for polymerization reaction, an excess amount of phosphorus compound may be used for polymerization reaction because such excess amount may not cause problem for reaction.

Such polymerization reaction can be conducted by adding a base solution to a solution of phosphorus compound and aldehyde compound, by adding a solution of phosphorus compound and aldehyde compound to a base solution, or by adding a base solution and a solution of phosphorus compound and aldehyde compound to a reaction system at the same time. Accordingly, such solutions can be added in any order.

Such polymerization reaction may be conducted with a polymerization reaction time, set depending on reaction rate of monomer and desired molecular weight of resultant polymer. For example, a polymerization reaction time of 0.2 to 30 hours may be preferably set. Further, a termination agent for terminating a polymer reaction may be added to a reaction solution at any given timing, such as before starting reaction, during reaction, and after reaction.

Such polymerization reaction can be conducted without controlling a reaction temperature, but can be progressed at room temperature in a good manner. However, such reaction temperature may be increased to enhance reaction efficiency, or can be decreased to set a mild reaction condition.

A description is now given to an example of a polymer of organic semiconductor material preferably used in an exemplary embodiment. However, other polymers within a scope of the present invention can be also used.

A measurement of polymer was conducted as follows. A measurement of number average molecular weight (Mn), weight-average molecular weight (Mw), and molecular weight distribution (Mw/Mn) was conducted with a gel permeation chromatography (GPC), and resultant polymer was calculated as polystyrene compound based on UV (ultra violet) absorption rate and differential refractive index using monodisperse polystyrene as reference polymer.

An example polymer of organic semiconductor material was prepared as follows. Specifically, dialdehyde of 0.852 g (2.70 mmol), shown in chemical formula (5), and diphosphonate of 1.525 g (2.70 mmol), shown in chemical formula (6) were put in a 100 ml flask, and substituted with nitrogen, and then tetrahydrofuran of 75 ml was put in the flask. Then, dm-3 tetrahydrofuran solution of 6.75 ml (6.75 mmol) having potassium t-butoxide of 1.0 mol was dropped to the flask, and the solution was agitated for 20 hours at room temperature. Then, benzylphosphonate and benzaldehyde were added to the flask, and the solution was agitated for 2 hours and 30 minutes. Then, acetic acid of 1 ml was added to the flask to end the reaction, and the solution was washed with water. After removing solvent under a depressurized condition, residual was dissolved in tetrahydrofuran of 15 ml and methanol of 80 ml, and the precipitated and purified to obtain a polymer shown in chemical formula (7) for 1.07 g.

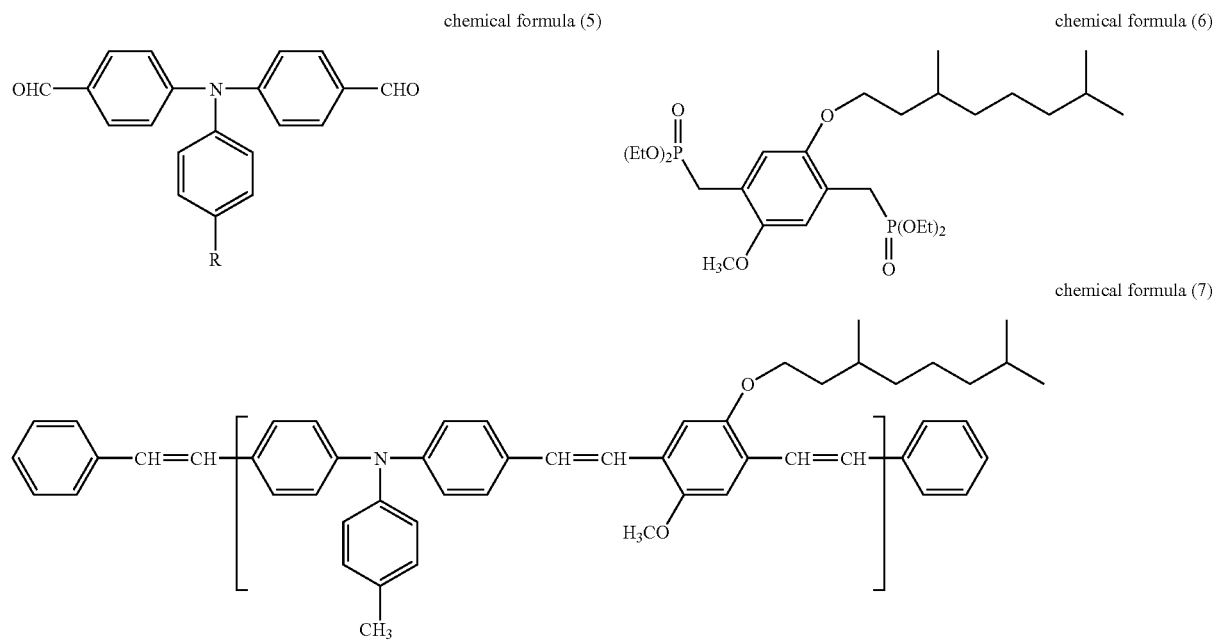

The resultant polymer, measured for molecular weight and molecular weight distribution, had a yield of 73%, a weight average molecular weight (Mw) of 104000, a number average molecular weight (Mn) of 36000, a molecular weight distribution (Mw/Mn) of 2.89, and number of repeating units of polymer of 63.

Figure 6:
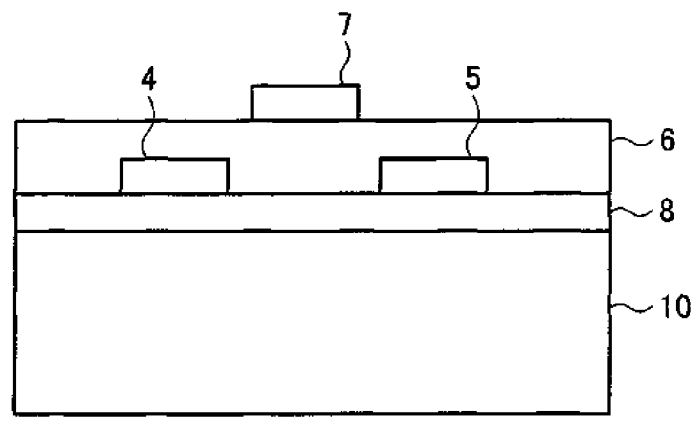
FIG. 6 shows a schematic cross-sectional view of an organic transistor element of top gate type fabricated by a method according to an exemplary embodiment.
Figure 7:
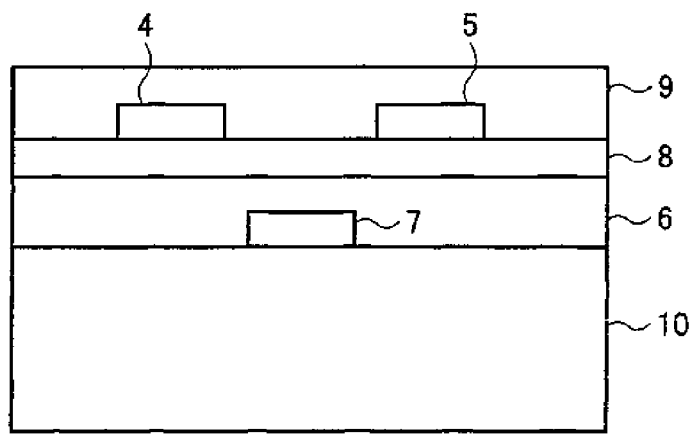
FIG. 7 shows a schematic cross-sectional view of an organic transistor element of bottom gate type fabricated by a method according to an exemplary embodiment.

With such solution including organic semiconductor material, an organic thin film transistor shown in FIGS. 6 and 7 can be formed, for example. Such organic thin film transistor may be a top gate type or bottom gate type, for example.

In case of top gate type, an organic thin film transistor includes a source electrode and a drain electrode on an organic semiconductor layer formed on a substrate, such as paper-based material, and a gate electrode is formed over the source electrode, the drain electrode, and the organic semiconductor layer via a gate insulation layer.

In case of bottom gate type, an organic thin film transistor includes a gate electrode and a gate insulation layer formed on a substrate, and an organic semiconductor layer formed on the gate insulation layer, and a source electrode and a drain electrode formed on the organic semiconductor layer.

FIG. 6 illustrates an example of an organic thin film transistor of top gate type. As illustrated in FIG. 6, an organic semiconductor layer 8 is formed on a substrate 10, such as paper-based material, and a source electrode 4 (as first electrode) and a drain electrode 5 (as second electrode) are formed and electronically connected on the organic semiconductor layer 8. Further, a gate insulation layer 6 is formed over the source electrode 4, the drain electrode 5, and the organic semiconductor layer 8, and then a gate electrode 7 (as third electrode) is formed on the gate insulation layer 6, wherein the gate electrode 7 is positioned between the source electrode 4 and the drain electrode 5. A voltage is applied to the source electrode 4 and the drain electrode 5, and a voltage is applied to the gate electrode 7 for controlling a transistor.

FIG. 7 illustrates an example of an organic thin film transistor of bottom gate type. As illustrated in FIG. 7, a gate electrode 7 is formed on a substrate 10, such as paper-based material, and a gate insulation layer 6 and an organic semiconductor layer 8 are formed over the gate electrode 7 in this order. Then, a source electrode 4 and a drain electrode 5 are formed and electronically connected on the organic semiconductor layer 8, and a sealing layer 9 is formed over the organic semiconductor layer 8. A voltage is applied to the source electrode 4 and the drain electrode 5, and a voltage is applied to the gate electrode 7 for controlling a transistor.

Further, a solution dispensed as droplet 43 may include an organic EL (electroluminescence) material, for example. Such solution may be composed of solvent and dye for RGB (red, green, blue). For example, a solvent is dodecylbenzene/dichlorobenzene (volume ratio of 1/1), a red dye is polyfluorene/perylene dye (weight ratio of 98/2), a green dye is polyfluorene/coumarin dye (weight ratio of 98.5/1.5), and a blue dye is polyfluorene.

Further, a solution dispensed as droplet 43 may be a solution including a low-molecular weight organic EL material, polymer organic EL material, and polyvinyl carbazole, which is soluble to benzene derivative, polyphenylenevinylene (poly p-phenylenevinylene derivative), and polyphenylene derivative, for example. The organic EL material may be rubrene, perylene, 9,10-diphenylanthracene, tetraphenylbutadiene, nile red, coumarin 6, quinacridone, and polythiophene derivative, for example.

In an exemplary embodiment, a solution preferably include a solvent, such as benzene derivative having a boiling point of 150 degrees Celsius or greater. Such solvent may be o-dichlorobenzene, m-dichlorobenzene, 1,2,3-trichlorobenzene, o-chlorotoluene, p-chlorotoluene, 1-chloronaphthalene, bromobenzene, o-dibromobenzene, and 1-dibromonaphthalene, for example. Such solvent may be preferable from a viewpoint of suppressing volatilization or vaporization of solvent. Further such solvent may be preferable from a viewpoint of greater solubility of aromatic compound. Further, a solution preferably includes dodecylbenzene as solvent, wherein dodecylbenzene may be n-dodecylbenzene, or a mixture of isomer of n-dodecylbenzene, for example.

Such solvent may preferably have a boiling point of 300 degrees Celsius or more, and a viscosity of 6 centipoise or more (at 20 degrees Celsius). A solution may include one type of solvent, but may preferably include another solvent to effectively suppress volatilization or vaporization of solvent. Further, because the above-mentioned solvents except dodecylbenzene have a relatively smaller viscosity, viscosity of the above-mentioned solvents may be preferably adjusted to a given value by adding another solvent to the solution.

In an exemplary embodiment, the above described solution is dispensed as droplet on a substrate, such as paper-based material with the fabrication apparatus shown in FIG. 2 or FIG. 3, and then a functional layer (or film) is formed on the substrate by processing the substrate with a given temperature set higher than a temperature when droplet is dispensed on the substrate. In general, droplet is preferably dispensed on the substrate at room temperature, and then the substrate is heated to a higher temperature. Such heating process may be conducted because a solid content, deposited by volatilization or vaporization of solvent or decreased temperature at the time of dispensing solution, can be remelted by heating, by which a functional layer or film may be formed on the substrate uniformly.

Further, such heating process may be preferably conducted under a pressurized condition when to form a functional layer or film on the substrate. By setting such pressurized condition, volatilization or vaporization of solvent during heating process can be further suppressed and re-melting of solid content can be further progressed, by which a more uniform functional layer or film may be formed on the substrate.

Further, after such heating process, the substrate may be set in a depressurized condition immediately to remove the solvent quickly. With such depressurizing process, a phase separation of contents in a solution, which may occur when solvent is condensed, can be suppressed.

As above described, an organic EL element can be formed on a substrate by depositing solid content on the substrate by vaporizing volatile material in a solution. Accordingly, a solid content in a solution is used as light emitting material and a solvent, made of volatile material, is used as vehicle for dispensing solid content on a substrate, wherein such dispensing may be conducted by inkjet method.

Figure 8:
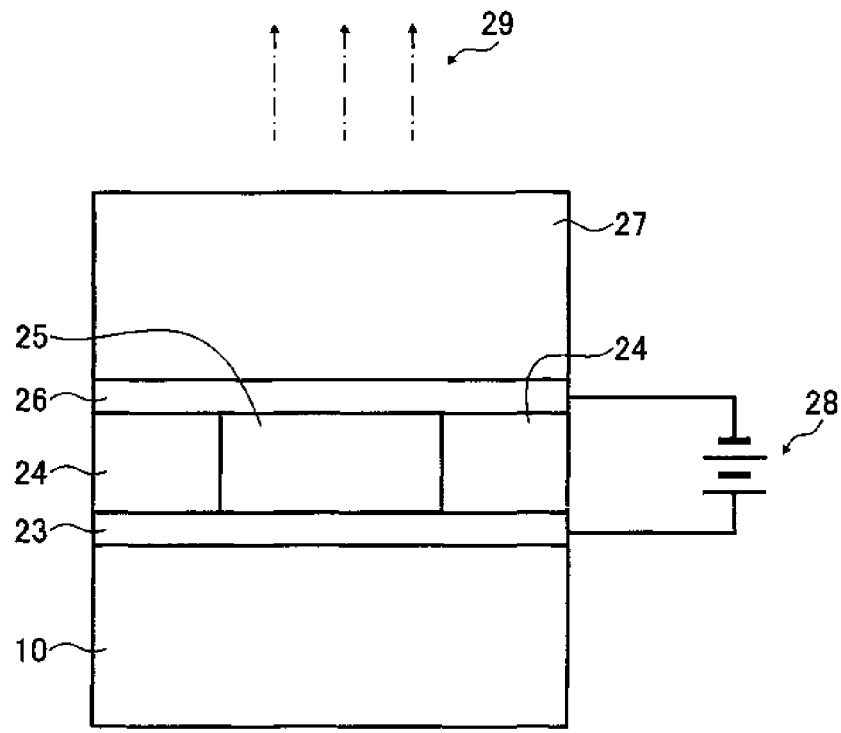
FIG. 8 shows a schematic cross-sectional view of an organic electro-luminescent (EL) element fabricated by a method according to an exemplary embodiment.

FIG. 8 illustrates a cross-sectional view of a display unit using an organic EL material of an exemplary embodiment.

As illustrated in FIG. 8, an electrode 23 and a separation wall 24 is formed on a substrate 10, such as paper-based material. The separation wall 24 may be made of organic photosensitive material. Then an organic EL layer 25 is formed in an area surrounded by the separation wall 24 by dispensing a solution including the above-described organic EL material, by removing solvent, and by depositing solid content. Further, a transparent electrode 26, such as ITO (indium-tin oxide), is formed on the organic EL layer 25, and a transparent sheet 27 is formed on the transparent electrode 26. Such transparent electrode 26 and transparent sheet 27 may be made of transparent PET (polyethylene terephthalate) sheet having an ITO (indium-tin oxide) layer on one side of the sheet.

With such configuration shown in FIG. 8, the display unit may emit light generated by the organic EL layer 25 in a direction shown by an arrow 29. Further, such display unit may preferably have flexibility and light weight.

Further, a solution dispensed as droplet 43 may be made of a precursor substance of silicon glass, used as insulation layer for semiconductor, or a material for quartz glass. Such precursor substance may be polysilazane (e.g., product of Tonen-General Sekiyu K.K.) and organic SOG (spin on glass) material, for example.

Further, an electrode may be made of material such as electrically conductive polymer having an enhanced electric conductivity by doping. For example, such electrically conductive polymer may be conductive polyaniline, conductive polypyrrole, conductive polythiophene (e.g., complex of polyethylenedioxythiophene and polystyrenesulfonic acid). Further, a solution dispersing nanoparticles (having a size of 1 nm to 50 nm) of platinum, gold, or silver may be preferably used for forming a wiring pattern and an antenna pattern for a RFID (radiofrequency identification) device, to be described later.

In an exemplary embodiment, a solution dispensed as droplet 43 may include any electronic function material for fabricating a wiring pattern or an electronic device. Accordingly, such electronic function material may include conductive materials, described in this disclosure, and insulating materials.

Next, the jet head unit 11 according to an exemplary embodiment is described with reference to FIGS. 9A, 9B, and 10.

Figure 9A:
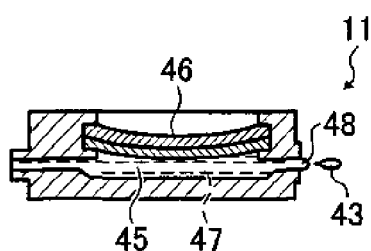
FIGS. 9A and 9B illustrate a jetting process of a jet head utilizing a piezoelectric element.
Figure 9B:
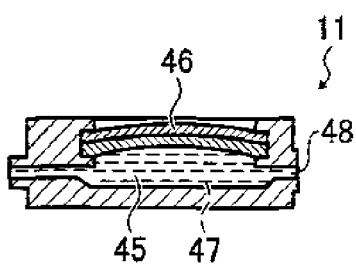

As illustrated in FIGS. 9A and 9B, the liquid jet head 11 includes a piezoelectric element 46 and a chamber 45, and a nozzle 48, for example. The piezoelectric element 46 generates and applies vibration energy to the chamber 45, storing solution 47, to dispense a droplet 43 from the nozzle 48.

Specifically, a pulse signal is applied to the piezoelectric element 46 to deform the piezoelectric element 46 as shown in FIG. 9A, by which a capacity of the chamber 45 is reduced and a pressure wave occurs in the chamber 45. Such pressure wave causes the droplet 43 to be dispensed from the nozzle 48. FIG. 9B illustrates a state where the piezoelectric element 46 returns to its original shape, by which the capacity of the chamber 45 is increased.

Figure 11:
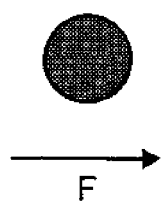
FIG. 11 illustrates an exemplary shape of a flying droplet dispensed from the jet head of FIG. 10.
Figure 12:
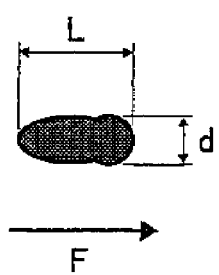
FIG. 12 illustrates another exemplary shape of a flying droplet dispensed from the jet head of FIG. 10.

When the droplet 43 is dispensed from the jet head unit 11, the droplet 43 may have a shape as shown in FIG. 11 or 12, wherein the droplet 43 is dispensed by a force generated by the piezoelectric element 46, which is generated by converting electric power to mechanical displacement. Specifically, a flying droplet may have a substantially circular shape as shown in FIG. 11, or a pillar-like shape extending in a flying direction shown by an arrow F in FIG. 12. Such flying droplet shown in FIG. 12 may have a circular portion having a diameter of d, and a length L as a whole, in which the length L may be within three times of the diameter d.

When a droplet is jetted from a nozzle of a jet head with an effect of a piezoelectric element, which converts electric energy to mechanical displacement, a shape of droplet may be determined based on a pressure force applied to a solution (e.g., liquid) from the piezoelectric element, in which the pressure force may have differential values over the time.

When such jet head employing a piezoelectric element is used for jetting a droplet with a given condition (e.g., drive pulse voltage), a jetted droplet may have a substantially circular shape, or a pillar-like shape having a circular portion, in which a length of jetted droplet is within three times of a diameter of the circular portion as shown in FIGS. 11 and 12.

In such condition, such jetted droplet may fly stably without receiving disturbances, in which a flying speed of droplet may be 5 m/s to 12 m/s, for example.

In an exemplary embodiment, a jet head may be used to dispense a solution including electronic function material on a substrate for forming a wiring pattern or an electronic device under such condition that a flying droplet has a shape shown in FIG. 11 or 12.

If a dispensing condition of a jet head may deviate from such desired condition shown in FIG. 11 or 12, an adjustment process may be performed as follows. Specifically, a solution including electronic function material or an equivalent liquid (in terms of viscosity, surface tension) is jetted from a jet head, and a shape of jetted solution (or flying droplet) is observed with a microscope. Then, a drive pulse, applied to a piezoelectric element, is adjusted to adjust a shape of flying droplet to a desired shape shown in FIG. 11 or 12. Based on such adjustment process, an adjusted drive pulse signal is set to a fabrication apparatus of an exemplary embodiment and applied to a piezoelectric element of a jet head to dispense a droplet having the above described desired shape, in which such adjusted drive pulse signal may be determined by setting a given value to pulse voltage, pulse time, and pulse waveform.

Figure 10:
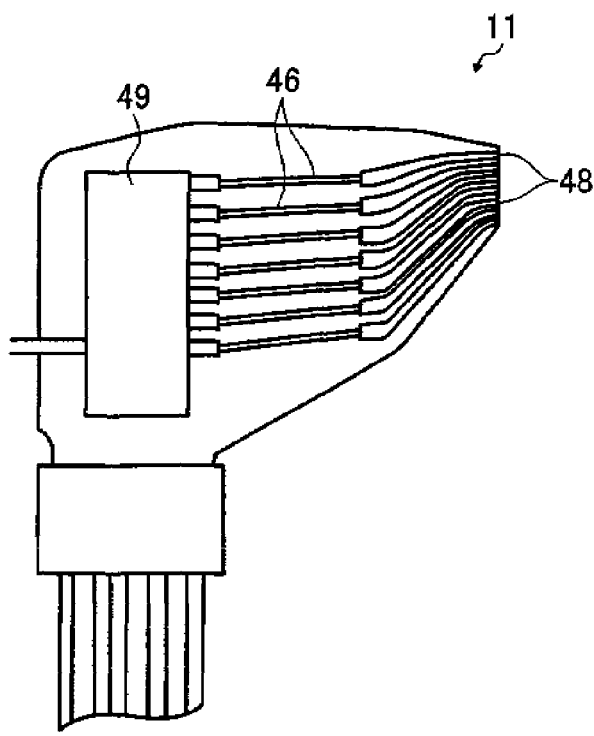
FIG. 10 shows an exemplary structure of a jet head utilizing a piezoelectric element.

As illustrated in FIG. 10, the solution 47 is introduced into the chamber 45 through a filter 49, which may be provided within the jet head unit 11 to devise a filtering function at a given location proximity of the nozzle 48. Such filter 49 can trap foreign particles larger than conductive fine particles or nanoparticles in a solution to prevent deterioration of functionality of a wiring pattern or an electronic device formed on a substrate. Such filter 49 can be manufactured in compact size and simple structure, by which the jet head unit 11 can be embedded with the filter 49 therein as shown in FIG. 10, by which the jet head unit 11 can be also manufactured in compact size.

Preferably, the filter 49 may be made of a material such as stainless mesh or resin material, such as polytetrafluoroethylene or Teflon (registered trademark) and polypropylene, for example. In other words, the filter 49 should be made of a material having an effective anti-corrosioness to a solution used in an exemplary embodiment. Further, the filter 49 may have a mesh size (or pore size), which can trap foreign material (or foreign particles) having a size, which is 30 times or greater than a diameter of fine particles in a solution.

Specifically, a solution containing fine particles (used as electronic function material) having a diameter of 0.0001 μm to 0.2 μm (0.1 nm to 200 nm) is used, and more preferably, a solution containing fine particles having a diameter of 0.0001 μm to 0.05 μm (0.1 nm to 50 nm) is used in an exemplary embodiment. Accordingly, if the filter 49 may have a mesh size (or pore size), which can trap foreign material having a size of 0.003 μm to 0.6 μm, more preferably 0.003 μm to 1.5 μm or greater, the filter 49 can trap such foreign material having such size effectively, and thereby the nozzle 48 may not be clogged by foreign material. Generally, a filtering performance (or removal performance) of a filter may be measured in absolute removal rate or average removal rate. In an exemplary embodiment, the filter 49 may have a mesh size (i.e., size of foreign material that can be trapped) determined based on absolute removal rate.

Although FIG. 10 shows a configuration that the filter 49 is embedded in the jet head unit 11, the filter 49 is not required to be embedded in the jet head unit 11. Further, it should be noted that a plurality of filters can be disposed in a fabrication apparatus, as required. If a plurality of filters is disposed, one filter located at a position nearest to the nozzle 48, may have a mesh size described in the above to effectively filter or remove foreign material in a solution. Such filter 49 can be similarly provided to other jet head using a thermal method or bubble method in addition to the above described jet head using a piezoelectric element, which converts electric energy to mechanical displacement.

Figure 13A:
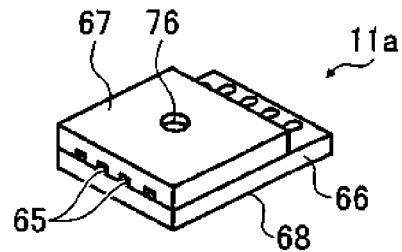
FIGS. 13A, 13B, and 13C show an example of a jet head of a thermal type.
Figure 13B:
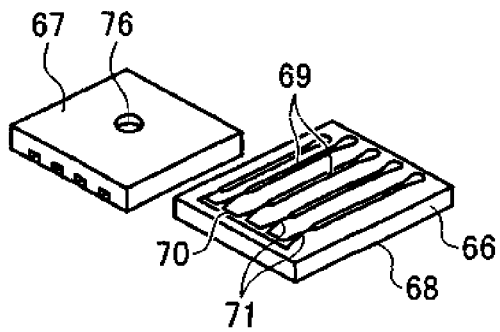
Figure 13C:
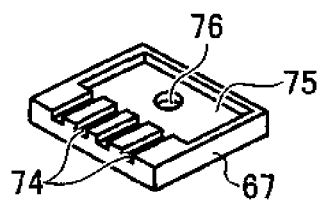

Next, another jet head is described with reference to FIGS. 13A to 13C. FIGS. 13A to 13C illustrate a jet head unit 11*a* using bubble method, in which a bubble is generated instantaneously in liquid by heating liquid to a higher temperature (e.g., 300 to 500 degrees Celsius) in a short period of time (e.g., 1 μs to 10 μs), and then a droplet is jetted from a nozzle with an effect of such bubble.

For example, such jet head is called as edge-shooter type, which jets droplets from an end portion of a liquid chamber.

The jet head unit 11*a* shown in FIG. 13 has four nozzles, for example. Such jet head unit 11*a* can be manufactured by coupling a thermal element unit 66 and a cover unit 67. The thermal element unit 66 has an individual electrode 69, a common electrode 70, and a heating element 71, which are formed on a silicon substrate 68 by a wafer process.

As illustrated in FIG. 13C, the cover unit 67 has grooves 74, and a recess 75, for example. The grooves 74 become channels for guiding solution containing a functional material, and the recess 75 configures a common fluid chamber for reserving solution, which is to be guided through the grooves 74.

The cover unit 67 is combined with the thermal element unit 66 as shown in FIG. 13A to form the above-mentioned channels and the common fluid chamber. When the thermal element unit 66 and the cover unit 67 are coupled to each other, the thermal elements 71 are positioned at a position corresponding to the channels.

In such configuration, nozzles 65 are formed at the ends of the channels, from which a droplet of solution is dispensed. Although the shape of the nozzles 65 is formed in a rectangular shape, the shape of the nozzles 65 may be formed in a circular shape.

In addition, a solution inlet port 76 is formed in the cover unit 67 to allow supply of solution into the solution supply chamber using a supply unit (not shown).

With a consideration on stability of droplet jetting process, a nozzle plate may be provided on the nozzle 65 to set a desired nozzle diameter and a desired nozzle shape (e.g., circular shape). Such nozzle plate may be made of a material, such as Ni, and formed with high precision by using an electroforming technique, for example. Alternately, a nozzle plate having nozzle holes may be formed by performing an excimer laser process on a resin film (substrate), for example.

Figure 14:
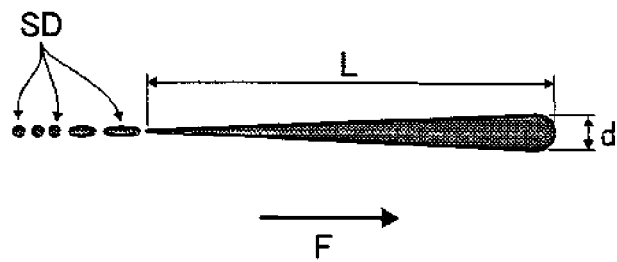
FIG. 14 illustrates an exemplary shape of a flying droplet dispensed from the jet head of FIG. 13A.

When the droplet 43 is dispensed from the jet head unit 11*a* shown in FIG. 13, the droplet 43 may have a shape shown in FIG. 14, wherein the droplet 43 is dispensed by a force of a bubble generated with an effect of heat generated by a heating element. Specifically, a flying droplet may have a substantially pillar-like shape extending in a flying direction shown by an arrow F in FIG. 14. Such pillar-like shape includes a circular portion having a diameter d and a length L as a whole, in which the length L may be five times or greater than the diameter d.

When a droplet is jetted from a nozzle of a jet head with an effect of heat of a heating element by a bubble method, which uses a force of a bubble generated with an effect of heat of a heating element, a shape of droplet may be determined based on a force applied to a solution (e.g., liquid) by the bubble.

Compared to a jet head using a piezoelectric element for jetting a droplet, a jet head using bubble method can jet droplet with a high pressure, by which a flying speed of droplets is relatively greater, such as 8 m/s to 18 m/s. When such jet head employing a heating element is used for jetting a droplet with a given condition, a jetted droplet may have a substantially pillar-like shape having a circular portion, in which a length of jetted droplet is five times or greater than a diameter of the circular portion, and having satellite droplets SD as shown in FIG. 14. Because such satellite droplets SD may also fly at a greater flying speed, the satellite droplets SD may impact on a position on a substrate, which has been already impacted by a pillar-like shape portion of droplet, a wiring pattern or an electronic device can be formed on substrate correctly.

In an exemplary embodiment, a jet head may be used to dispense a solution including electronic function material on a substrate for forming a wiring pattern or an electronic device under such condition that a flying droplet has a shape shown in FIG. 14.

If a dispensing condition of a jet head may deviate from such desired condition shown in FIG. 14, an adjustment process may be performed as follows. Specifically, a solution including electronic function material or an equivalent liquid (in terms of viscosity, surface tension) is jetted from a jet head, and a shape of jetted solution (or flying droplet) is observed with a microscope. Then, a drive pulse, applied to a heating element, is adjusted to adjust a shape of flying droplet to a desired shape shown in FIG. 14. Based on such adjustment process, an adjusted drive pulse signal is set to a fabrication apparatus of an exemplary embodiment and applied to a heating element of a jet head to dispense a droplet having the above described desired shape, in which such adjusted drive pulse signal may be determined by setting a given value to pulse voltage, pulse time, and pulse waveform. For example, a pulse voltage or pulse time (or width) is incrementally increased to set a desired shape of droplet.

In an exemplary embodiment, a plurality of droplets is impacted on a substrate to form an electronic device or a wiring pattern. Accordingly, if a jet head having multiple nozzles is used, an electronic device or a wiring pattern can be formed on a substrate efficiently (e.g., shorter time). Although the jet head unit 11*a* shown in FIG. 13 includes four nozzles, the number of nozzles can be adjusted to any given number to enhance pattern forming efficiency. However, if the number of nozzles is increased too great, a manufacturing cost of jet head unit may be undesirably increased and nozzles may clog with a higher probability. Accordingly, the number of nozzles of a jet head unit may be determined based on consideration of several factors, such as apparatus manufacturing cost, apparatus manufacturing efficiency, or the like.

Figure 15:
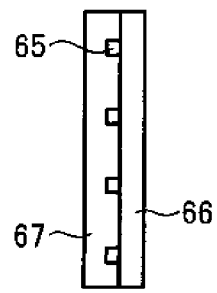
FIG. 15 illustrates a multi-nozzle type jet head, viewed from a nozzle side.
Figure 16:
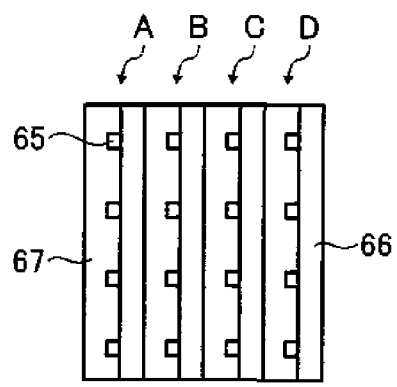
FIG. 16 illustrates multi-nozzle type jet heads, stacked one on the other.
Figure 17:
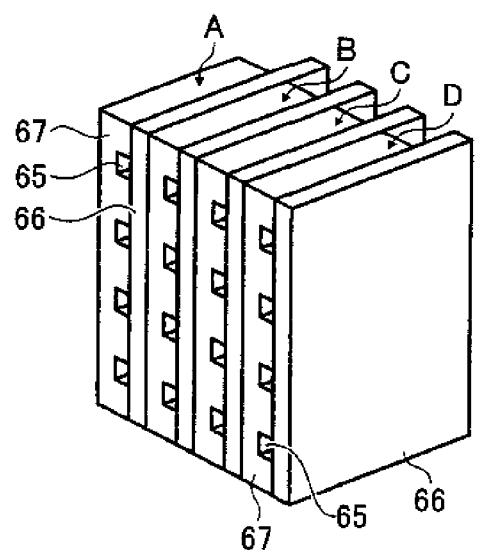
FIG. 17 is a perspective view of the multi-nozzle type jet head of FIG. 16.

FIG. 15 illustrates a jet head having multiple-nozzle viewed from the nozzle 65. As illustrated in FIGS. 16 and 17, such jet head having multiple-nozzle array may be provided as jet head assembly, and such jet head assembly may be used to dispense different kinds of solution from different nozzle array. Further, such jet head assembly may be held by a carriage in a fabrication apparatus.

Specifically, as illustrated in FIGS. 16 and 17, a jet head assembly includes jet heads A, B, C, and D, for example. Each of the jet heads A, B, C, and D includes the nozzles 65. Solutions containing different kinds of compounds (e.g., electronic function material, conductive fine particles, nanoparticles) can be dispensed from the nozzles 65 of the respective jet heads A, B, C, and D.

In an exemplary embodiment, an electronic device or the like can be fabricated by applying a solution containing electronic function material on a substrate. Such solution may be various different types of solutions.

For example, when different types of solutions are jetted from the jet heads shown in FIGS. 15 to 17, a device shown in FIGS. 6 and 7 can be easily fabricated by stacking different patterns one by one using corresponding solutions on a substrate. When to stack different patterns, a pattern may be formed on a preceding pattern after the preceding pattern is dried. If a pattern is formed on a preceding pattern before the preceding pattern is dried, such two patterns may be easily mixed, by which patterns may not be formed precisely on a substrate, which may not desirable.

Specifically, a device shown in FIGS. 6 and 7 may be fabricated by forming a first pattern on a substrate by dispensing a first solution from a jet head held by a carriage, vaporizing volatile material and drying the first pattern, and then forming a second pattern on the first pattern by dispensing a second solution from the jet head held by the carriage, in which the carriage is moved to a home position after dispensing a solution for each pattern.

In case of a fabrication apparatus, which does not move a carriage holding a jet head but moves a substrate in a given direction (e.g., X, Y direction), a device shown in FIGS. 6 and 7 may be fabricated by forming a first pattern on a substrate by dispensing a first solution from a jet head held by a carriage, vaporizing volatile material and drying the first pattern, and then forming a second pattern on the first pattern by dispensing a second solution from the jet head held by the carriage, in which the substrate is moved to a home position by a substrate transporter after dispensing a solution for each pattern. Although such substrate transporter is not shown in the fabrication apparatus of FIG. 2, the substrate transporter, such as roller type transporter or belt type transporter, may be provided in a fabrication apparatus, for example. With such configuration, patterns can be formed on a substrate with higher precision, by which a wiring pattern or an electronic device having higher quality can be fabricated.

Further, the above-mentioned substrate transporter can be used to form patterns on a back face of a substrate. Specifically, after forming a wiring pattern or an electronic device on a first face of a substrate, faces of such substrate are reversed with the substrate transporter and then a wiring pattern or an electronic device is formed on a second face of the substrate, by which a wiring pattern or an electronic device can be formed on each face of the substrate. A substrate can be reversed with known methods, such as double side printing method used in an inkjet printer or the like, for example.

If a wiring pattern or an electronic device is formed on both faces of substrate as such, an electronic component having enhanced functionality can be fabricated. For example, an electronic component having multiple functions, a memory device having a greater capacity, an electronic component having complex function or the like can be fabricated. Further, if a wiring pattern or an electronic device is formed on both faces of substrate as such, a size of substrate can be set smaller.

Further, if a wiring pattern or an electronic device having different function are formed on both faces of substrate, an electronic component of hybrid type can be fabricated. For example, a RFID (radio frequency-identification) device having a memory, a communication circuit, and a miniaturized antenna can be fabricated by forming a memory on a first face (or front face) of a substrate and forming a communication circuit and a miniaturized antenna on a second face (or back face) of the substrate.

A description is now given to a RFID device, which can be preferably fabricated with a method according to an exemplary embodiment.

A RFID device may include a memory, a communication circuit, and a miniaturized antenna, wherein each unit can be formed on a substrate by dispensing solutions having different electronic function material with a method according to an exemplary embodiment.

Conventionally, a RFID chip is composed of a substrate manufactured by semiconductor process, and an antenna and an electrode pattern manufactured by another process, wherein such substrate, antenna, and electrode pattern need to be integrated to fabricate a RFID chip. In general, such process may need complicated and time-consuming process.

Compared to such conventional method, a method according to an exemplary embodiment can form or print elements required for a RFID device on a substrate, such as paper, with a relatively simple process, by which a manufacturing cost of a RFID device can be reduced.

An application of such jetting method is not limited to forming a chip device on a substrate, such as paper sheet, but such jetting method can be applied to other paper, such as corrugated cardboard used for a package sheet, to form a "chip device" on the package sheet.

For example, a RFID device can be formed or printed on a cardboard for package sheet with such jetting method. Such RFID device may store history data or traceability information of commercial goods. Accordingly, such package sheet having a RFID device may have a enhanced functionality in an industrial usage, such as product management system and logistic system, for example.

Generally, a package sheet may be formed into a cuboid or a box, which has a three-dimensional structure. If a RFID device is to be formed on such cuboids, an inkjet method may be preferably used because a solution including electronic function material can be jetted to the face of cuboids without contacting a jet head directly on the package sheet. On one hand, an image forming apparatus using Carlson process may have some difficulty to form a RFID device on such package having a three-dimensional structure.

Figure 18:
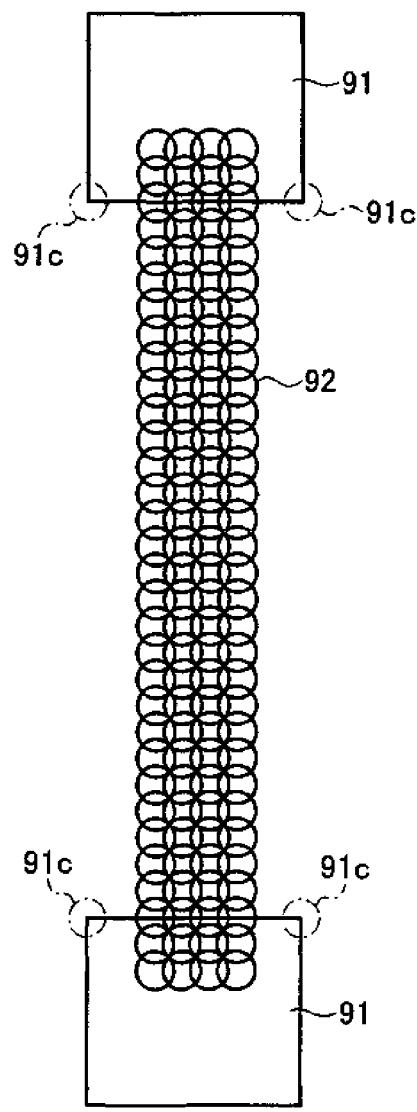
FIG. 18 illustrates an example of a wiring pattern formed by dots of droplets or solution according to a method of an exemplary embodiment.

Next, a pattern formation on a substrate according to an exemplary embodiment is described. FIG. 18 illustrates one wiring pattern formed on a substrate by using a method according to an exemplary embodiment.

As illustrated in FIG. 18, a wiring pattern 92 is formed on a substrate by jetting a solution containing fine particles to a terminal pattern (or electrode pattern) 91, which is formed in advance on the substrate. The terminal pattern 91 may have a rectangular shape, for example. In the drawings, each dot is illustrated in a manner being tangent to another diagonally situated dot for the purpose of simplifying the drawing. However, dots are arranged in higher density (arranged in a more overlapped manner) so that there are no uncoated areas in a wiring pattern portion for an actual product.

Figure 19:
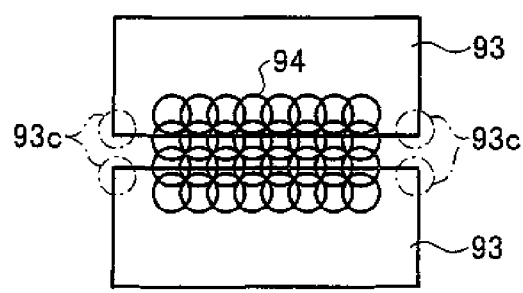
FIG. 19 illustrates an example of a device formed by dots of droplets or solution according to a method of an exemplary embodiment.

FIG. 19 shows one device formed on a substrate by using a method technique according to an exemplary embodiment. As illustrated in FIG. 19, a device is formed by forming a dot pattern 94 on a substrate by jetting a solution containing electronic function material between a pair of device electrodes 93, which is formed in advance on the substrate as a rectangular shape.

However, the above-mentioned wiring pattern or device may have a drawback of abnormal electric discharge, which may occur at the terminal pattern 91 or the device electrode 93 during usage of wiring pattern or device. A description is given to such abnormal electric discharge with reference to FIGS. 18 and 19.

In an exemplary embodiment, the wiring pattern 92, being formed by dot patterns of a solution containing electronic function material, is arranged between a plurality of terminal patterns 91, and similarly, the dot pattern 94, formed by dot patterns of a solution containing electronic function material, is arranged between the device electrodes 93.

Typically, the terminal patterns 91 or the device electrodes 93 are shaped as a rectangular pattern or a combination of rectangular patterns because rectangular shapes are cost effective for manufacturing.

However, because corner portions 91C and 93C of the electrode patterns 91 and the device electrodes 93 have a sharp edge, an electric field may concentrate at the corner portions 91C and 93C. As a result, when the voltage is applied between the electrodes, an abnormal electric discharge may occur at the corner portions 91C and 93C, by which a desired level of device functionality may not be obtained or damages may occur at the corner portions 91C and 93C.

Figure 20:
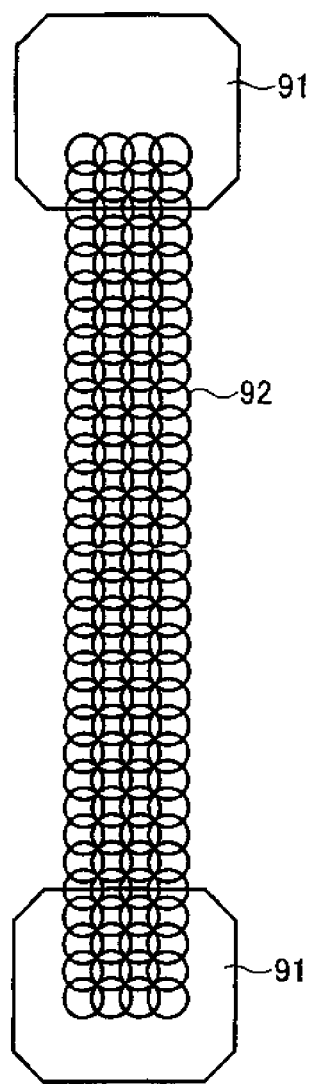
FIG. 20 illustrates an example of a wiring pattern, which is moderating an abnormal electric discharge at a corner portion of the wiring pattern shown in FIG. 18.
Figure 21:
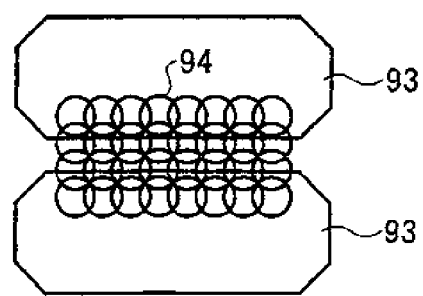
FIG. 21 illustrates an example of a device, which is moderating an abnormal electric discharge at a corner portion of the device shown in FIG. 19.

In view of such phenomenon, in an exemplary embodiment, a corner portion of the electrodes pattern 91 and device electrode 93 are formed into a chamfered shape (see FIGS. 20 and 21), for example. Such corner portions are chamfered by specifying degrees c_in mechanical drawings, or the chamfer may be defined by specifying the radius of curvature RXX in mechanical drawings. Typically, a size of the chamfered portion is approximately {fraction (½)} to {fraction (⅕)} of the diameter of a dot pattern. That is, if a size of c2 μm to c5 μm or r2 μm to r5 μm is formed at the corner portion of electrodes, an electric field concentration may not occur at the electrodes.

Accordingly, by removing sharp edged portions from the electrodes and suppressing concentration of electric field, abnormal electric discharge may not occur and a wiring pattern or an electronic device can preferably maintain its functionality over a longer period of time.

Next, another pattern formation on a substrate according to an exemplary embodiment is described with reference to FIGS. 22 and 23. A wiring pattern or an electronic device shown in FIGS. 22 and 23 are similar to those shown in FIGS. 18 to 21.

In case of FIGS. 18 to 21, the electrode pattern 91 or device electrode 93 are formed into desired shapes by conducting a photolithography technique, an etching technique to a metal thin film (e.g., Al, Au, Cu) formed on a substrate in advance. On one hand, in case of FIGS. 22 and 23, the electrode pattern 91 and device electrode 93 are formed by applying a solution on a substrate with a method according to an exemplary embodiment.

That is, in the same manner as the formation of wiring pattern and electronic device, a solution containing a conductive fine particle material (e.g., Ag) is employed to form the electrode patterns 91 and device electrode 93 as a combination of dots. Such method may have advantages of being able to use the fabrication apparatus shown in FIGS. 2 and 3, and being able to suppress the above-described abnormal electric discharge, which may be caused by sharp edged portion.

Figure 22:
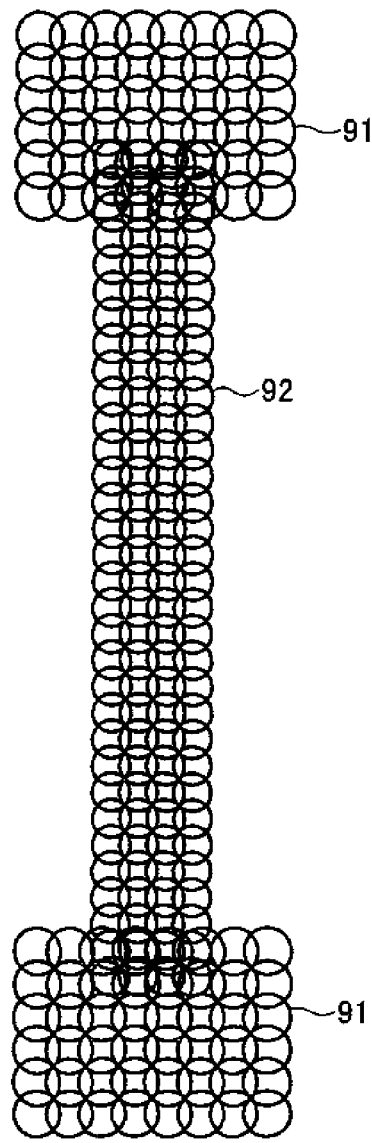
FIG. 22 illustrates another example of a wiring pattern, which is moderating an abnormal electric discharge at a corner portion of the wiring pattern shown in FIG. 18.
Figure 23:
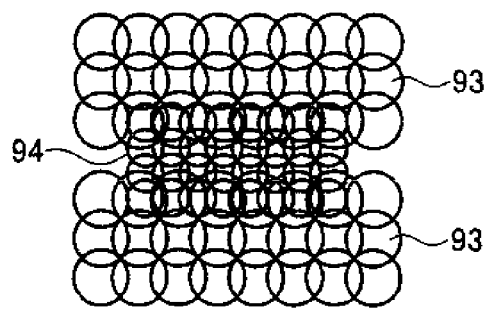
FIG. 23 illustrates another example of a device, which is moderating an abnormal electric discharge at a corner portion of the device shown in FIG. 19.

AS illustrated in FIGS. 22 and 23, a corner portion of the electrode pattern 91 and device electrode 93 may be automatically shaped into a chamfered shape by forming the electrode pattern 91 and device electrode 93 with dot patterns by jetting a solution having metal fine particles dispersed therein because each dot is shaped in a round shape having no edged portions.

Although a dot diameter for forming the electrode pattern 91 and device electrode 93 are illustrated greater than those of the wiring pattern 92 and dot pattern 94 in FIGS. 22 and 23, the dot patterns for the electrode pattern 91 and device electrode 93 may be formed on a substrate with a same dot size for the wiring pattern 92 and dot pattern 94 by using a same jet head having a same nozzle size.

The wiring pattern 92 formed of a combination of dots (shown in FIG. 18) may be formed as stripe-shaped pattern extending in a longitudinal direction, and the device (shown in FIG. 19) may be also formed with the dot pattern 94 having a stripe-shaped pattern. Such stripe-shaped pattern extending in parallel to the X/Y direction (see FIGS. 2 and 3) can be formed by moving the carriage 12 mounting the jet head unit 11 in X/Y direction, or by moving the substrate 14 in X/Y direction. During such movement of the jet head unit 11 or the substrate 14, a position of the jet head unit 11 over the substrate 14 relatively changes. Accordingly, a pattern formation on a substrate can be controlled in a simplified manner because the jet head unit 11 or the substrate 14 are moved in X/Y direction, and thereby a pattern can be formed on a substrate with a higher precision while reducing cost for such pattern formation.

An extending direction of such patterns may be set in parallel to respective sides of a rectangular substrate or parallel to matrix array of to-be-formed devices, by which a positioning and/or formation of patterns can be conducted with higher precision.

Next, another method for suppressing the aforementioned abnormal electric discharge is described with reference to FIGS. 24 to 27.

Figure 24:
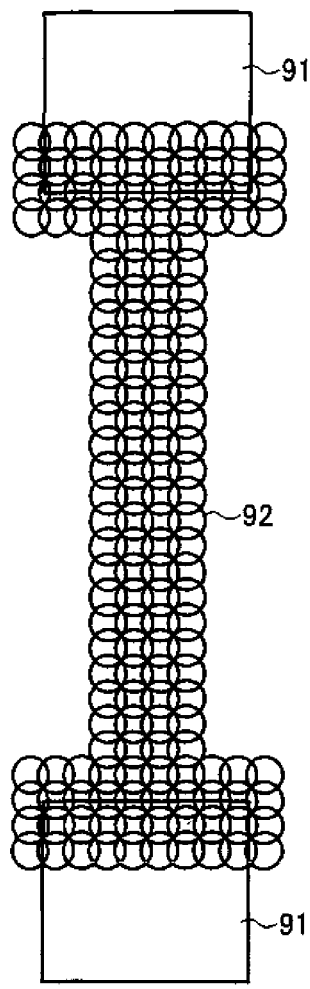
FIG. 24 illustrates another example of a wiring pattern, which is moderating an abnormal electric discharge at a corner portion of the wiring pattern shown in FIG. 18.
Figure 25:
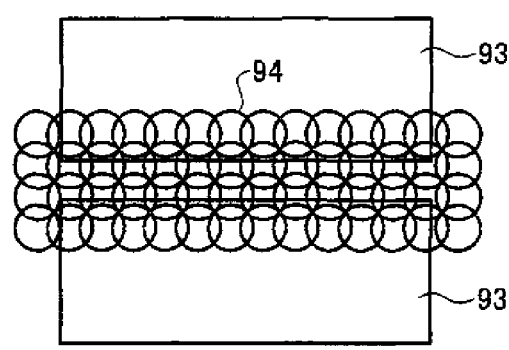
FIG. 25 illustrates another example of a device, which is moderating an abnormal electric discharge at a corner portion of the device shown in FIG. 19.
Figure 26:
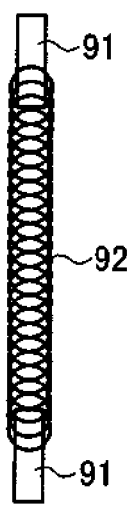
FIG. 26 illustrates another example of a wiring pattern, which is moderating an abnormal electric discharge at a corner portion of the wiring pattern.
Figure 27:
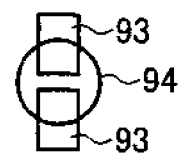
FIG. 27 illustrates another example of a device, which is moderating an abnormal electric discharge at a corner portion of the device.

As shown in FIGS. 24 and 25, the wiring pattern 92 or the dot pattern 94 are formed in a manner covering corner portions of the electrode pattern 91 and device electrode 93 so as to prevent exposure of the corner portions. Although the wiring pattern 92 shown in FIG. 24 is illustrated as a four-row dot pattern, the wiring pattern 92 may be formed as a single-row dot pattern as shown in FIG. 26. Similarly, a device shown in FIG. 25, illustrated as a four-row dot pattern, may be formed with a single-row dot pattern as shown in FIG. 27.

In short, abnormal electric discharge caused by electric field concentration at sharp edged portions can be suppressed by covering the sharp edged portions of the electrode pattern 91 and device electrode 93 with dot patterns, by which a wiring pattern or electronic device can preferably maintain its functionality over a longer period of time.

Figure 28:
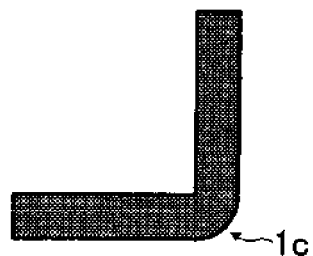
FIG. 28 is an enlarged view of a corner portion of the wiring pattern shown in FIG. 1B.

Next, another pattern formation on a substrate according to an exemplary embodiment is described with reference to FIGS. 28 and 32. FIG. 28 is an enlarged view of a corner portion of a wiring pattern 1 shown in FIG. 1B. As illustrated in FIG. 28, the wiring pattern 1 may be provided with a corner portion 1c, which has a rounded shape to suppress the aforementioned electric field concentration, while the wiring pattern 1 bends in a substantially right angle at such corner portion 1c.

A description is now given to such bended portion of a wiring pattern with reference to FIGS. 29 to 32.

Figure 29:
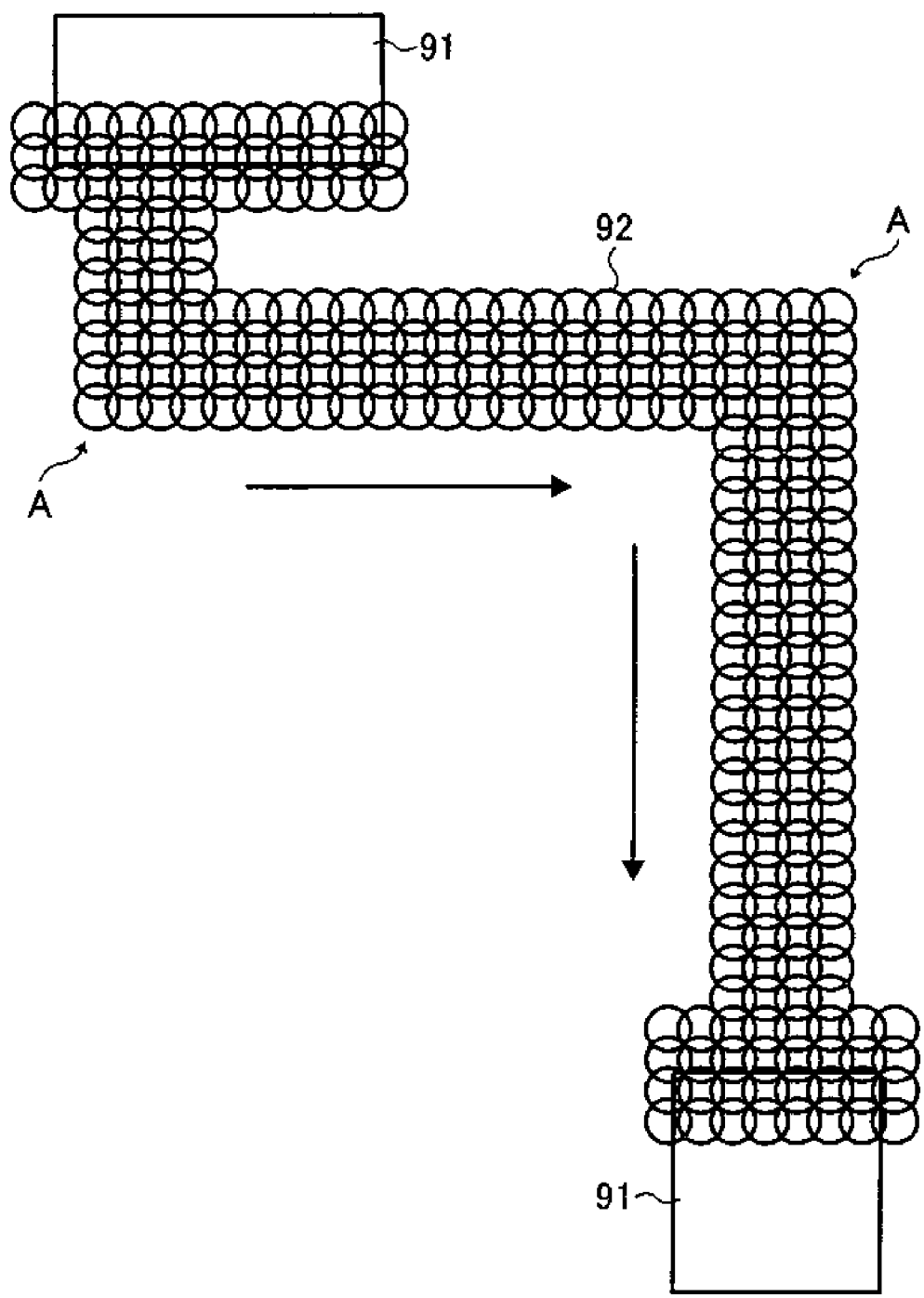
FIG. 29 illustrates an exemplary configuration of a wiring pattern substrate fabricated by a fabrication apparatus according to an exemplary embodiment.

FIG. 29 illustrates an example of a wiring pattern formed on a substrate by using an inkjet method according to an exemplary embodiment. In such example, dot patterns are combined in a manner where the wiring pattern 92 is bent 90 degrees (right angle) in midstream. That is, the wiring pattern 92 is formed as a stripe-shape pattern extending in parallel to the two perpendicular directions (as indicated with arrows), and is bent according to an arrangement condition of the wiring pattern 92. In this case, as shown in part A of FIG. 29, an outer area of the bending portion of the wiring pattern 92 is formed as a curve. By forming dot patterns in such manner, the corner portion of the wiring pattern 92 may not be shaped in a sharp edge, by which an electric field concentration can be suppressed.

Figure 30:
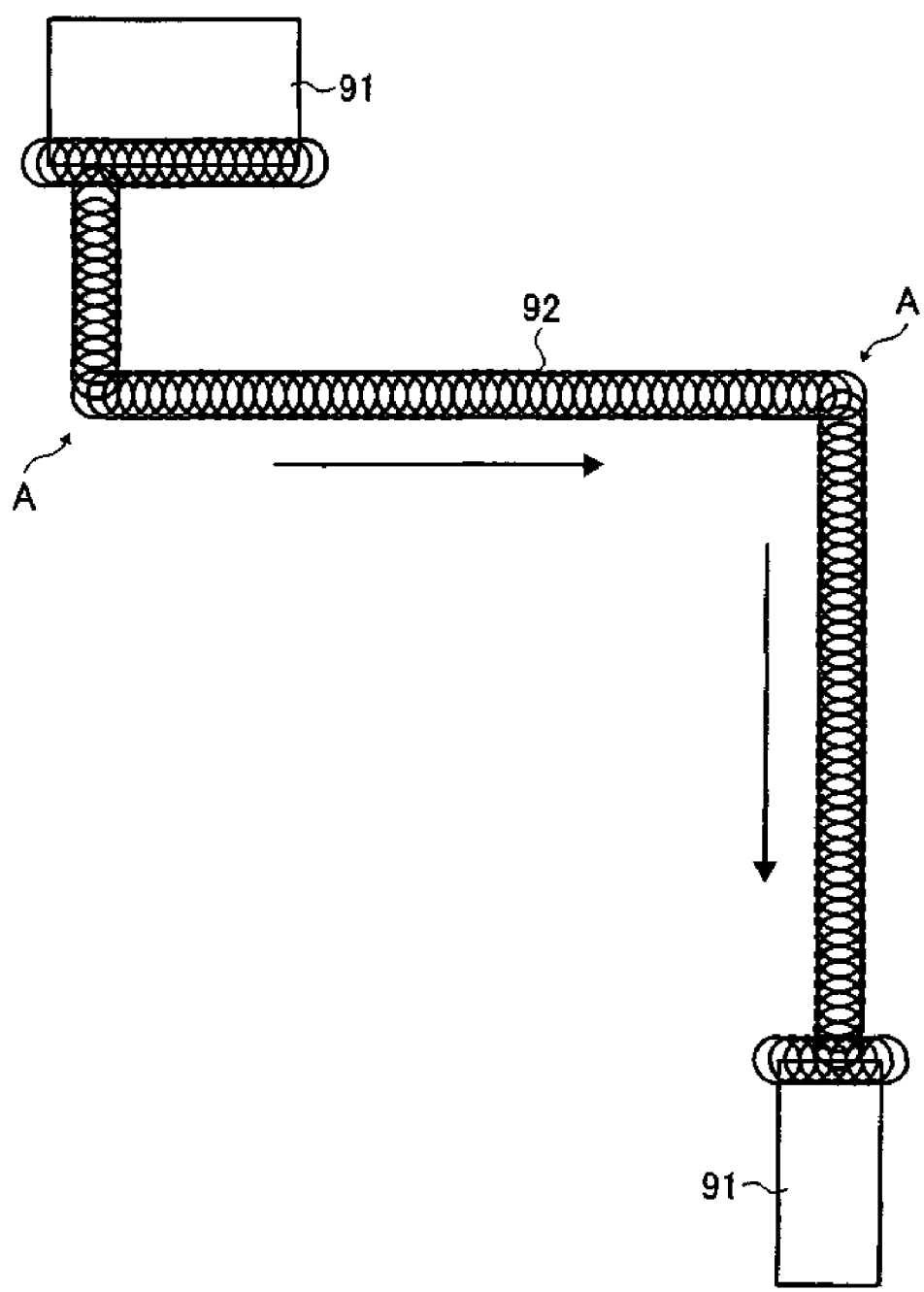
FIG. 30 illustrates another exemplary configuration of a wiring pattern substrate fabricated by a fabrication apparatus according to an exemplary embodiment.

FIG. 30 illustrates another example of a wiring pattern 92 formed in a manner having a dot pattern formed in a single row. In this case also, the corner portion of the wiring pattern 92 (part A in FIG. 30) may not be shaped in a sharp edge, by which an electric field concentration can be suppressed.

Figure 31:
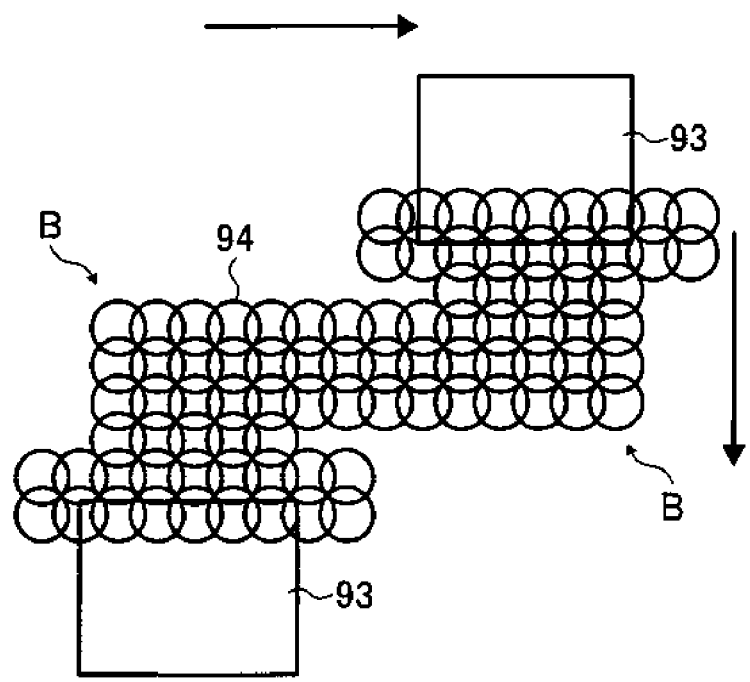
FIG. 31 illustrates an example of a device substrate fabricated by a fabrication apparatus according to an exemplary embodiment.

FIG. 31 illustrates an example of an electronic device formed on a substrate by using an inkjet method according to an exemplary embodiment.

In this example, a device is formed by jetting a solution containing electronic function material between the device electrodes 93, which are formed on a substrate in advance in a rectangular shape or a combination of rectangles. In this case also, the dot pattern 94 (or device pattern portion) is formed as a stripe-shape pattern, and the stripe-shape pattern is bent 90 degrees in midstream so as to obtain a desired device shape. As shown in part B of FIG. 31, the corner portion of the dot pattern 94 may not be shaped in a sharp edge, by which an electric field concentration can be suppressed.

Figure 32:
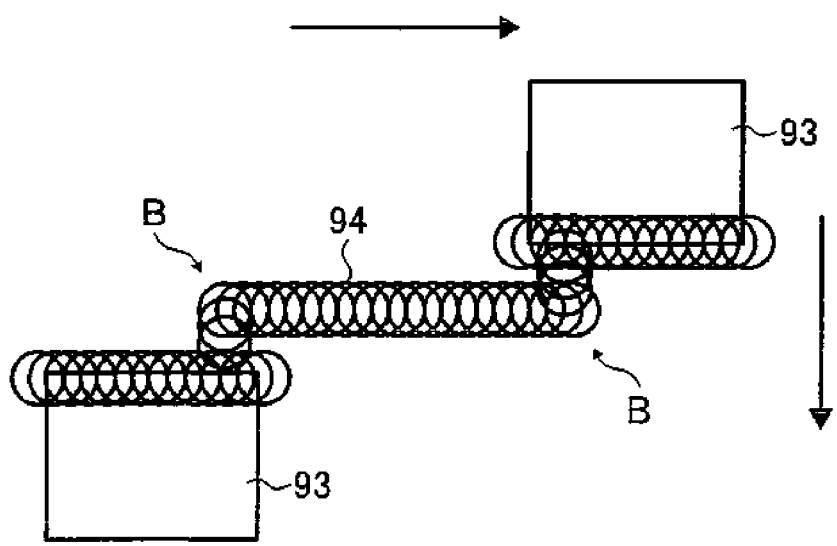
FIG. 32 illustrates another exemplary configuration of device substrate fabricated by a fabrication apparatus according to an exemplary embodiment.

FIG. 32 illustrates another example of an electronic device formed in a manner having the dot pattern 94 formed in a single row. In this case also, the corner portion of the dot pattern 94 (part B in FIG. 32) can be formed without sharp edged portion. Accordingly, an electric field concentration can be suppressed.

As illustrated in FIGS. 18, 20, 24, 26, 29, and 30, the wiring pattern 92 formed of a combination of dots is formed as stripe-shaped pattern extending in a longitudinal direction, and as illustrated in FIGS. 19, 21, 25, 31, and 32, the electronic device is also formed with the dot pattern 94 having a stripe-shaped pattern.

Such stripe-shaped pattern extending in parallel to the X/Y direction (see FIGS. 2 and 3) can be formed by moving the carriage 12 mounting the jet head unit 11 in X/Y direction, or by moving the substrate 14 in X/Y direction. During such movement of the jet head unit 11 or the substrate 14, a position of the jet head unit 11 over the substrate 14 relatively changes. Accordingly, a pattern formation on a substrate can be controlled in a simplified manner because the jet head unit 11 or the substrate 14 are moved in X/Y direction, and thereby a pattern can be formed on a substrate with a higher precision while reducing cost for such pattern formation.

An extending direction of such patterns may be set in parallel to respective sides of a rectangular substrate or parallel to matrix array of to-be-formed devices, by which a positioning and/or formation of patterns can be conducted with higher precision.

As above described, a substrate using paper or paper-based material is applied with a solution including electronic function material to form an electronic device or a wiring pattern in an exemplary embodiment. Such substrate may have surface properties, which may be attributed to cellulose fibers configuring paper. For example, a paper may have concavity and convexity on its surface due to thickness variation of cellulose fibers and space among cellulose fibers stacked one on the other. Such concavity and convexity may not be preferable for fabricating a wiring pattern sheet or electronic device sheet having higher quality.

In view of such situation, in an exemplary embodiment, a relationship of surface properties of paper and wiring pattern quality was evaluated. As above described, cellulose fibers may have a thickness of 5 μm to 20 μm, in general, although thickness of cellulose fibers may vary depending on types of papers. In general, a paper manufacturing process includes a beating process for beating cellulose fibers by a beater to soften cellulose fibers. Accordingly, a paper product may be configured with cellulose fibers having a thickness, which is smaller than a thickness of 5 μm to 20 μm. Generally, a paper product manufactured with a beating process may be configured with cellulose fibers having a thickness of 4 μm to 10 μm, for example.

In an exemplary embodiment, a wiring pattern or an electronic device is formed on a surface of paper configured with such cellulose fibers by depositing solid content in a solution having electronic function material as dot pattern. Accordingly, surface properties of paper may effect on dot pattern quality, such as circularity level of dot.

In view of such situation, in an exemplary embodiment, a relationship between surface roughness of paper and quality of a wiring pattern or an electronic device was evaluated as follows. As above described, paper has surface properties, such as concavity and convexity, which may be determined by cellulose fibers and coating material, which may effect pattern formation condition.

As described later, papers having different surface properties were prepared by adjusting fiber thickness, amount of coating material, and a wiring pattern shown in FIG. 26 was formed on each of papers. Such wiring pattern was evaluated by sensory evaluation method and durability test of wiring pattern.

In such paper preparation process, a roller coating method was employed to apply a coating material on paper, in which whole one face was coated with a coating material. Although a coating material can be applied to whole one face of paper by a spray coating method, a roller coating method was employed to uniformly apply a coating material on paper. Further, although a coating material can be applied on paper with an inkjet method, a roller coating method was employed to apply a coating material on paper with a shorter time.

A wiring pattern was formed on a paper by using a jet head having a piezoelectric element shown in FIG. 9 and FIG. 10 with providing a nozzle plate on the jet head, wherein the nozzle plate was formed of nickel (Ni) with an electro-forming technique and had a thickness of 20 μm.

Further, such jet head was provided with 256 nozzles and density of nozzles was set to 180 dpi (dot per inch), and each nozzle had a diameter of 20 μm (or area of 314 μm$^2$).

A solution used in an exemplary embodiment was prepared as water solution including colloidal silver, which was prepared as follows.

First, DISPERBYK® 190 (BYK-Chemie GmbH, solid content ratio of 40% mass weight) of 23.3 g and ion-exchanged water of 420.5 g were put into Kolben of 2 liters. Such Kolben was placed in a water bath, and stirred at 50 degrees Celsius until DISPERBYK® was dissolved. Silver nitrate of 100 g having been dissolved into ion exchange water of 420.5 g was added thereto while being stirred, and stirred at 70 degrees Celsius for 10 minutes. Then, dimethylaminoethanol of 262 g was added thereto. The liquid quickly changed its color to black, and liquid temperature rose to 76 degrees Celsius. The liquid was left as it was When the liquid temperature decreased to 70 degrees Celsius, it was continuously stirred at such temperature for two hours. As a result, water solution of colloidal silver colored dark yellow was obtained.

The resultant reaction liquid was transferred to a plastic bottle of 1 liter, and the bottle was left standing in a constant temperature room at 60 degrees Celsius for 18 hours. An ultrafiltering system was constructed with an ultrafiltration module AHP1010 (trade name of Asahi Kasei Corporation, molecular weight cut off of 50000, number of filters of 400), a magnet pump, and a stainless cup of 3 liters having tube connection ports at its lower part, which were interconnected to each other with silicone tube.

The reaction liquid having been left standing in a constant temperature room at 60 degrees Celsius for 18 hours was put into a stainless cup, and ion exchange water of 2 liters was added to the liquid. Then, the pump was operated to perform an ultrafiltering process. After about 40 minutes, a filtered liquid by the ultrafiltering module reached 2 liters. At this time, ethanol of 2 liters was put into the stainless cup. Thereafter, it was confirmed that electric conductivity of the filtering liquid was 300 μS/cm or lower, and a concentration process was carried out until an amount of mother liquid reached 500 ml.

Subsequently, another ultrafiltering system was constructed with a 500 ml stainless cup, an ultrafiltering module ("AHP0013", trade name of Asahi Kasei Corporation; molecular weight cut off of 50000, number of filters of 100), a tube pump, and an aspirator. The mother liquid previously prepared was put into the stainless cup, and was concentrated to increase a solid concentration. When the mother liquid reached about 100 ml, the tube pump was stopped in operation, and at the end of the concentrating operation, a silver colloid ethanol solution having a 10% solid was obtained.

An average particle diameter of the colloidal silver particle in the solution was 0.017 μm (17 nm). The result of measurement by an instrument TG-DTA (Seiko Instruments Inc.) showed that a content of the silver in the solid was 90 mass weight % for 87 mass weight % of the charge.

Such water solution having colloidal silver was dispensed on substrates (e.g., paper-based material) having different surface properties with the above-mentioned jet head to form a wiring pattern shown in FIG. 26, wherein each dot was superimposed adjacent dots by about one third (⅓) of one dot size. A dot diameter was about 40 μm to 50 μm although the dot diameter may vary depending on surface properties of substrate. The electrode pattern 91 had a thickness of 0.5 μm, which was formed on the substrate by sputtering aluminum (Al) in advance. The jet head was applied with a drive voltage of 30 V having drive frequency of 12 kHz for driving a piezoelectric element.

After forming a wiring pattern on a substrate, the substrate was placed in an oven to dry the wiring pattern on a substrate at a temperature of 100 degrees Celsius for 10 minutes to obtain a dried layer having a thickness of about 0.2 μm and metallic luster. An electrical conductivity of the dried layer was evaluated using surface resistivity measured with Loresta FP (Mitsubishi Chemical Corporation) and such surface resistivity was not measurable (i.e., 108 Ω/sq. or more).

After irradiating a light having energy of 5 J/cm$^2$ to such dried layer with a low-pressure mercury lamp, the substrate was heated at 100 degrees Celsius for 40 minutes to obtain a metal layer. An electrical conductivity of the metal layer was evaluated using surface resistivity measured with Loresta FP (Mitsubishi Chemical Corporation) and such surface resistivity was measured as 3.76×100 Ω/sq.

Then, power having a pulse voltage of 30 V and a pulse width of 50 ms was applied repeatedly between the electrode patterns 91 with a pulse interval of 100 ms for 60 minutes to evaluate whether broken wire occurs on wiring pattern as durability test.

Table 2 and Table 3 show results of such evaluation test. A wiring pattern shape was evaluated for each sample by sensory evaluation method with microscopic observation using 100 magnifications, and "O" represents acceptable and "X" represents unacceptable. A durability test of wiring pattern was evaluated for each sample, and "O" represents no broken wire and "X" represents broken wire occurred.

Evaluation test 1 was conducted with paper using unbeaten fiber having thickness of fibers of 6 μm to 15 μm, space among stacked fibers of 4 μm to 6 μm, and a coating material, which is a solution dispersing calcium carbonate having a particle diameter of 1 μm using starch as binder.

TABLE 2

| No. | Coating | Surface roughness (μm) | Pattern check | Durability |
|---|---|---|---|---|
| 1 | No Coating | 6-10 | X | X |
| 2 | One time Coating | 3-6 | X | X |
| 3 | Two times Coating | 1-3 | O | O |

TABLE 2-continued

| No. | Coating | Surface roughness (μm) | Pattern check | Durability |
|---|---|---|---|---|
| 4 | Three times Coating | 1 | ○ | ○ |

Evaluation test 2 was conducted with paper using beaten fiber having thickness of fibers of 5 μm to 8 μm, space among stacked fibers of 4 μm to 5 μm, and a coating material, which is a solution dispersing calcium carbonate having a particle diameter of 1 μm using starch as binder.

TABLE 3

| No. | Coating | Surface roughness (μm) | Pattern check | Durability |
|---|---|---|---|---|
| 1 | No Coating | 4-6 | X | X |
| 2 | One time Coating | 1-3 | ○ | ○ |
| 3 | Two times Coating | 1 | ○ | ○ |

In the above evaluation tests, surface properties, such as concavity and convexity of paper used as substrate, was smoothed by applying a coating material (e.g., calcium carbonate and starch), wherein the concavity and convexity of paper is determined by thickness of cellulose fibers and spaces among stacked fibers. Based on results shown in Table 2 and Table 3, when the surface roughness of paper is effectively suppressed by surface treatment, compared to a level of concavity and convexity of paper before surface treatment, a broken wire may not occur to a wiring pattern, and a wiring pattern having preferable shape and durability can be formed.

Further, in an exemplary embodiment, other coating material having insulation fine particles can be used. For example, porous polyimide fine particles having surface resistivity of $10^{14}$ Ω/sq. or more prepared by adding amine catalytic agent to acid anhydride and diisocyanate, AlN fine particles having a size of 20 nm to 30 nm prepared by injecting Al particles (20 μm) to arc plasma, or SiOx fine particles prepared by gas evaporation method can be preferably used.

Although the above evaluation tests were conducted by forming a relatively simplified wiring pattern shown in FIG. 26, the results shown in Tables 2 and 3 can be similarly applied to other wiring pattern or electronic device, such as transistor. Accordingly, the above-described method for suppressing concavity and convexity of paper can be applied when to forming a device having a higher quality on a substrate.

In the above description, an inkjet method is mainly used to form a wiring pattern or an electronic device on a substrate using paper or paper-based material by directly dispensing electronic function material to the substrate. However, other technique can be used for forming a wiring pattern or an electronic device on a substrate. For example, an image forming apparatus using so called xerography or Carlson process can be preferably used for forming a wiring pattern or an electronic device on a substrate. A description is now given to an image forming apparatus using so called xerography or Carlson process.

Figure 33:
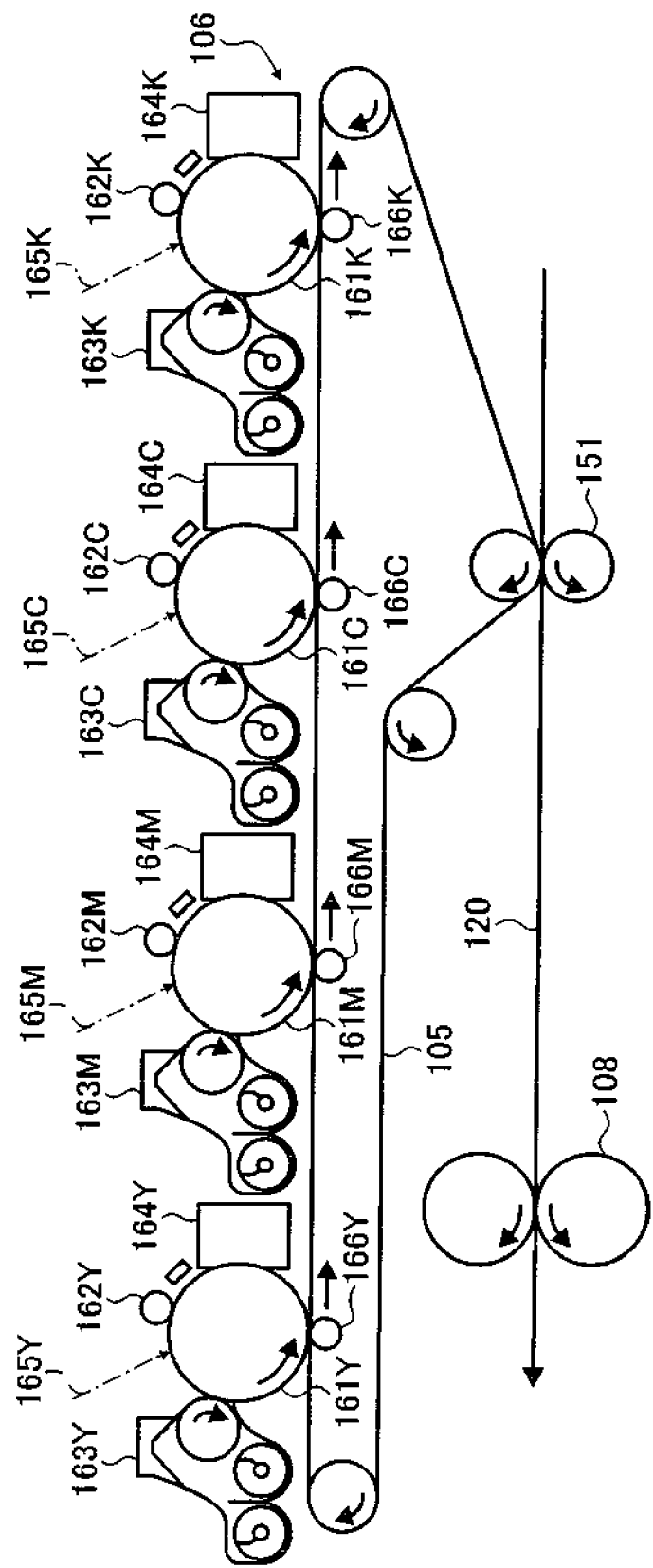
FIG. 33 illustrates an image forming section of an image forming apparatus employing Carlson process, in which photoconductor drums are arranged in tandem manner.
Figure 34:
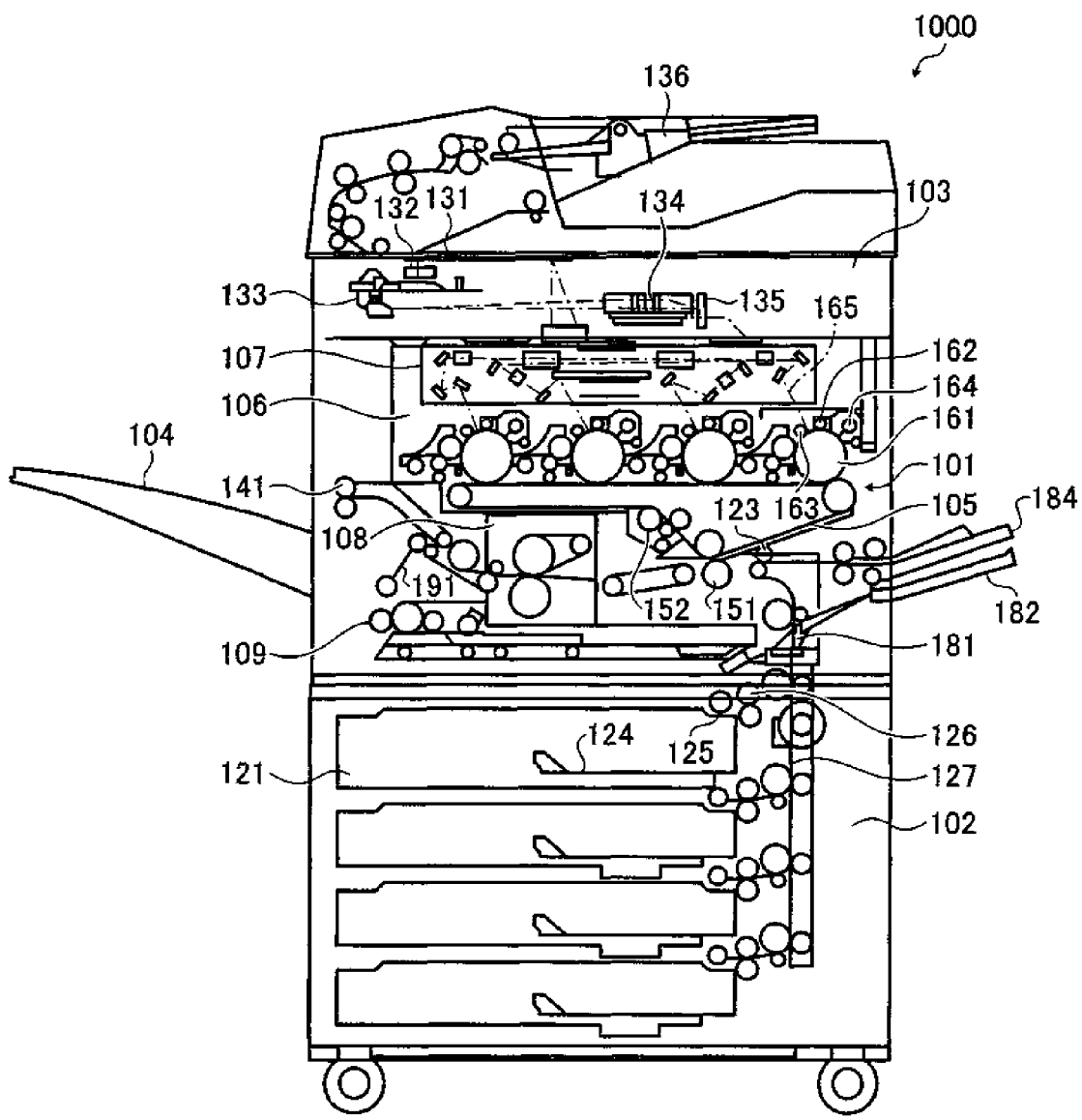
FIG. 34 illustrates an image forming apparatus having the image forming section employing Carlson process of FIG. 33, wherein the image forming apparatus is used as fabrication apparatus according to an exemplary embodiment.

FIGS. 33 and 34 illustrate another image forming apparatus for forming images on a paper. FIG. 33 illustrates an image forming section of an image forming apparatus, which may employ electrophotography or Carlson process, and FIG. 34 illustrates a schematic configuration of an image forming apparatus having arranged photoconductor drums (as image carrier) in tandem manner and using two-component developer.

As illustrated in FIG. 34, an image forming apparatus 1000 includes an image forming section 101, a sheet feed unit 102, and a scanner 103, for example. As illustrated in FIG. 34, the image forming section 101 is provided in a center of the image forming apparatus 1000, and the sheet feed unit 102 is provided below the image forming section 101. The sheet feed unit 102 may include a plurality of sheet trays 121. Further, the scanner 103, provided over the image forming section 101, scans document sheets. Further, a sheet ejection tray 10 is provided on a left side of the image forming section 101, which is used to stack recoding sheets having formed images thereon and ejected from the image forming section 101.

As illustrated in FIG. 33, the image forming section 101 includes an intermediate transfer belt 105 and a plurality of image forming units 106 for yellow (Y), magenta (M), cyan (C), and black (K) over the intermediate transfer belt 105. The intermediate transfer belt 105 may be an endless belt. An optical writing unit 107 is provided over the image forming section 101. As illustrated in FIG. 33, the image forming unit 106 includes a photoconductor 161, a charger 162, a development unit 163, and a cleaning unit 164 for each of yellow (Y), magenta (M), cyan (C), and black (K). The photoconductor 161 may have a drum shape, and surrounded by the charger 162, the development unit 163, and the cleaning unit 164, for example. The charger 162 charges a surface of the photoconductor 161. The optical writing unit 107 emits a laser beam 165 to the surface of the photoconductor 161 to form a latent image based on image information scanned by the scanner 103. The development unit 163 develops the latent image on the photoconductor 161 with toner particles. The cleaning unit 164 removes and recovers toner particles remaining on the photoconductor 161 after transferring toner particles to a recording sheet.

In such image forming apparatus 1000, each color image formed on each photoconductor 161 is superimposed on the intermediate transfer belt 105 to form one color image.

For example, a yellow (Y) toner image is developed by the developing unit 163Y and transferred to the intermediate transfer belt 105 with an effect of a primary transfer unit 166Y. Then, a magenta (M) toner image is developed by the developing unit 163M and transferred to the intermediate transfer belt 105 with an effect of a primary transfer unit 166M. Then, a cyan (C) toner image is developed by the developing unit 163C and transferred to the intermediate transfer belt 105 with an effect of a primary transfer unit 166C. Then, a black (K) toner image is developed by the developing unit 163C and transferred to the intermediate transfer belt 105 with an effect of a primary transfer unit 166K. Such four color images are superimposed to form a full color toner image on the intermediate transfer belt 105.

Such full color toner image is then transferred to a recording sheet 120, transported from the sheet feed unit 102, with an effect of a secondary transfer unit 151. The recording sheet 120 is then transported to a fusing unit 108 to fix four color images on the recording sheet 120, and ejected to the sheet ejection tray 104 or transported to a sheet inverting unit 109 with a sheet ejection roller 141.

When to form images on both face of the recording sheet 120, the recording sheet 120 is fed to the sheet inverting unit 109 by a branch member 191 and faces of the recording sheet 120 are inverted. Such face-inverted recording sheet 120 is transported to a registration roller 123, and after correcting a sheet skew, the recording sheet 120 is fed to the image forming section 101 to form an image on its back face. After transferring the full color toner image to the recording sheet 120, a belt cleaning unit 152 removes toner remaining on the intermediate transfer belt 105.

Recording sheets stored in the sheet tray 121 is pushed up in an upward direction so as to contact a top sheet in the sheet tray 121 to a pickup roller 125. Specifically, a support plate 124 in the sheet tray 121 is pivotably elevated to push up the recording sheets stored in the sheet tray 121.

With a rotation of a feed roller 126, the top sheet is extracted from the sheet tray 121, and then the recording sheet 120 is transported to the registration roller 123 via a vertical transport route 127. The registration roller 123 stops a transportation of the recording sheet 120 temporarily, and feeds the recording sheet 120 to the image forming section 101 with synchronizing a timing of toner image formation on the intermediate transfer belt 105 and a timing of feeding the recording sheet 120. The registration roller 123 may similarly conduct such sheet feed process to a recording sheet fed from a manual feed tray 184.

Further, the image forming apparatus may include a separation claw 181 and a jammed-sheet tray 182 for removing or ejecting a jammed-sheet. When sheet jamming occurs at a downstream of the vertical transport route 127, the separation claw 181 is activated to guide a jammed-sheet to the jammed-sheet tray 182.

The scanner 103 includes first and second carriages 132 and 133, which moves reciprocally to scan document sheets (not shown) placed on a contact glass 131. The first and second carriages 132 and 133 may include a light source and a mirror for scanning document optically. Image information scanned by the first and second carriages 132 and 133 is filtered by three-primary color filters for red (R), green (G), and blue (B) and focused on a CCD (charge coupled device) 135 with a lens 134 to convert image information into image signal. Such image signal is then digitized as color image data for image processing.

The scanner 103 has a given scanning resolution, such as 300 dpi (dot per inch), 600 dpi, 1200 dpi resolution, etc., for example.

Based on image data having received image processing, a laser diode LD (not shown) of the optical writing unit 107 emits a laser beam to the photoconductor 161 to form a latent image. Such laser beam is guided to the photoconductor 161 for yellow (Y), magenta (M), cyan (C), and black via a polygon mirror and a lens. As illustrated in FIG. 34, an ADF (automatic document feeder) 136 is placed over the scanner 103 to automatically feed document sheets to the contact glass 131.

In general, an image forming apparatus using Carlson process may use toner. However, in an exemplary embodiment, particles including electronic function material are used instead of ordinarily used toner. For example, a conductive material for forming electrodes, a material that can change its color with an application of electric signals, an insulation material or the like may be applied on a substrate, such as paper or paper-based material, to form a wiring pattern or an electronic device with an image forming apparatus using Carlson process. Image data for a wiring pattern or an electronic device may be input to the image forming apparatus 1000 with the scanner 103, or computer-generated graphics data may be input to the image forming apparatus 1000, for example. Such wiring pattern or electronic device can be formed on a paper by superimposing a plurality of patterns using different materials on the intermediate transfer belt 105, and then transferring the plurality of patterns on the paper. Further, such wiring pattern or electronic device can be formed on a paper by forming layers of patterns one by one by repeating image formation for each material.

In general, ordinarily used toners used for Carlson process include resin, coloring agent, charge control agent, parting agent, and additive agent. Such resin may be styrene (e.g., acrylic styrene) or polyester having a size of 1 to 10 µm. Such coloring agent is used to generate color.

In an exemplary embodiment, instead of coloring agent, electronic function material is used to form a wiring pattern or an electronic device on a substrate. Accordingly, conductive fine particles, light emitting material, semiconductor material, insulation material or the like, used for the above described inkjet method, are added to resin so as to prepare particles having electronic function material, which is used for forming a wiring pattern or an electronic device.

An image forming apparatus employing inkjet method may have a nozzle assembly for dispensing a solution. If such nozzle assembly has a length, which can be matched to a substrate width, a pattern can be formed on a substrate with higher speed. If such nozzle assembly has not a length, which can be matched to a substrate width, a pattern may be formed on a substrate with a slower speed because the nozzle assembly may need to move reciprocally over the substrate. Further, if a nozzle assembly can be designed to move in a greater length, a pattern can be formed on a substrate having a greater size, such as A0 size.

On one hand, an image forming apparatus employing Carlson process can form a pattern on a substrate with higher speed and volume, such as pattern formation of 100 to 200 sheets per minute, for example. Accordingly, Carlson process and inkjet method may be combined for an image forming process for forming devices with higher speed and volume. For example, an image forming apparatus employing Carlson process may be used to form a wide area layer, such as insulation layer and a protection layer on an entire face of the substrate, and an image forming apparatus employing inkjet method may be used to form a smaller area layer formed of electronic functional material on the substrate.

Further, an image forming apparatus employing Carlson process may be preferably used to apply a coating material on an entire face of paper (used as substrate) to smooth surface properties (e.g., concavity and convexity) of paper because an image forming apparatus employing Carlson process can form a pattern on a substrate with higher speed. The coating material may be used to set a surface condition of substrate to a smooth surface by suppressing concavity and convexity occurred by cellulose fibers, which are stacked one on the other. Further, an image forming apparatus employing Carlson process may include the fusing unit 108 having a heat roller and a pressure roller for fixing process. A pressure applied by such rollers may be useful for further smoothing concavity and convexity of substrate surface in addition to applying a coating material.

Further, the above described wiring pattern or electronic device may be coated with a resin layer (as protection member) on its both face to protect a front face having a wiring pattern or an electronic device and a back face from environmental effects, such as moisture.

Such protection member may be selectively coated on a substrate except electrical connection for connecting a wiring pattern or an electronic device to other external electronic component. In such selective coating process, an inkjet method may be preferably used. For example, a protection member can be formed on a substrate using wax material.

Such protection member can be formed on a substrate with other printing methods, a roller coating method, or the like. Further such protection member can be formed on a substrate selectively by using photosensitive polymer used for photoresist.

Such protection member may protect a wiring pattern or an electronic device from water/moisture, contamination, or physical impact, for example. Accordingly, a wiring pattern sheet or an electronic device sheet of an exemplary embodiment has a higher reliability on several aspects, such as water resistant, shock-proof, resistance to light energy, contamination resistance, and insulation performance, and so forth.

A description is now given to an electronic device 200 according to an exemplary embodiment.

Figure 35:
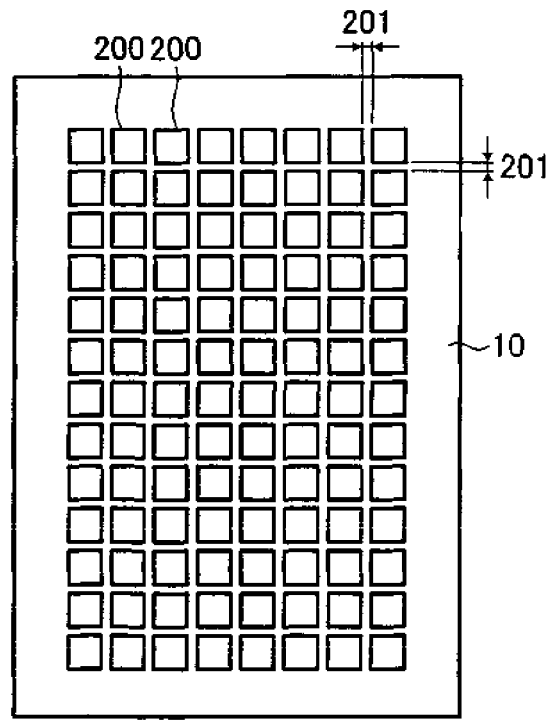
FIG. 35 illustrates an electronic device sheet having a plurality of electronic devices, fabricated by a fabrication apparatus according to an exemplary embodiment.

FIG. 35 illustrates an electronic device sheet having a plurality of electronic devices 200 on the substrate 10 made of paper or paper-based material. Although not illustrated, the electronic device 200 may be an integrated circuit having a number of circuits and transistors, which are formed by applying various solutions including electronic function material or insulation material on the substrate 10. Such electronic devices 200 are arranged on the substrate 10 with a device separation region 201 as illustrated in FIG. 35.

Figure 36:
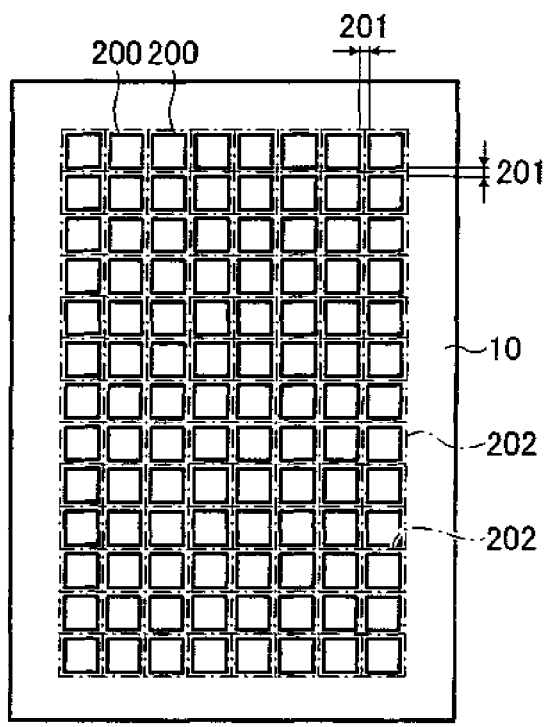
FIG. 36 and FIG. 37 illustrate the electronic device sheet of FIG. 35, having a separation line pattern.

Further, such electronic device sheet may include a separation line pattern 202 in the device separation region 201 as illustrated in FIG. 36. The separation line pattern 202 may be formed in the device separation region 201 so that a device separation line can be recognized clearly. Such separation line pattern 202 can be also formed on the substrate 10 (e.g., paper or paper-based material) with an image forming apparatus according to exemplary embodiments. The separation line pattern 202 may be formed by using a solution including electronic function material or a color agent, which may be used for identifying separation lines. Such separation line pattern 202 may become a marker for cutting the electronic devices 200 from the substrate 10, by which cutting portion can be recognized easily.

Figure 37:
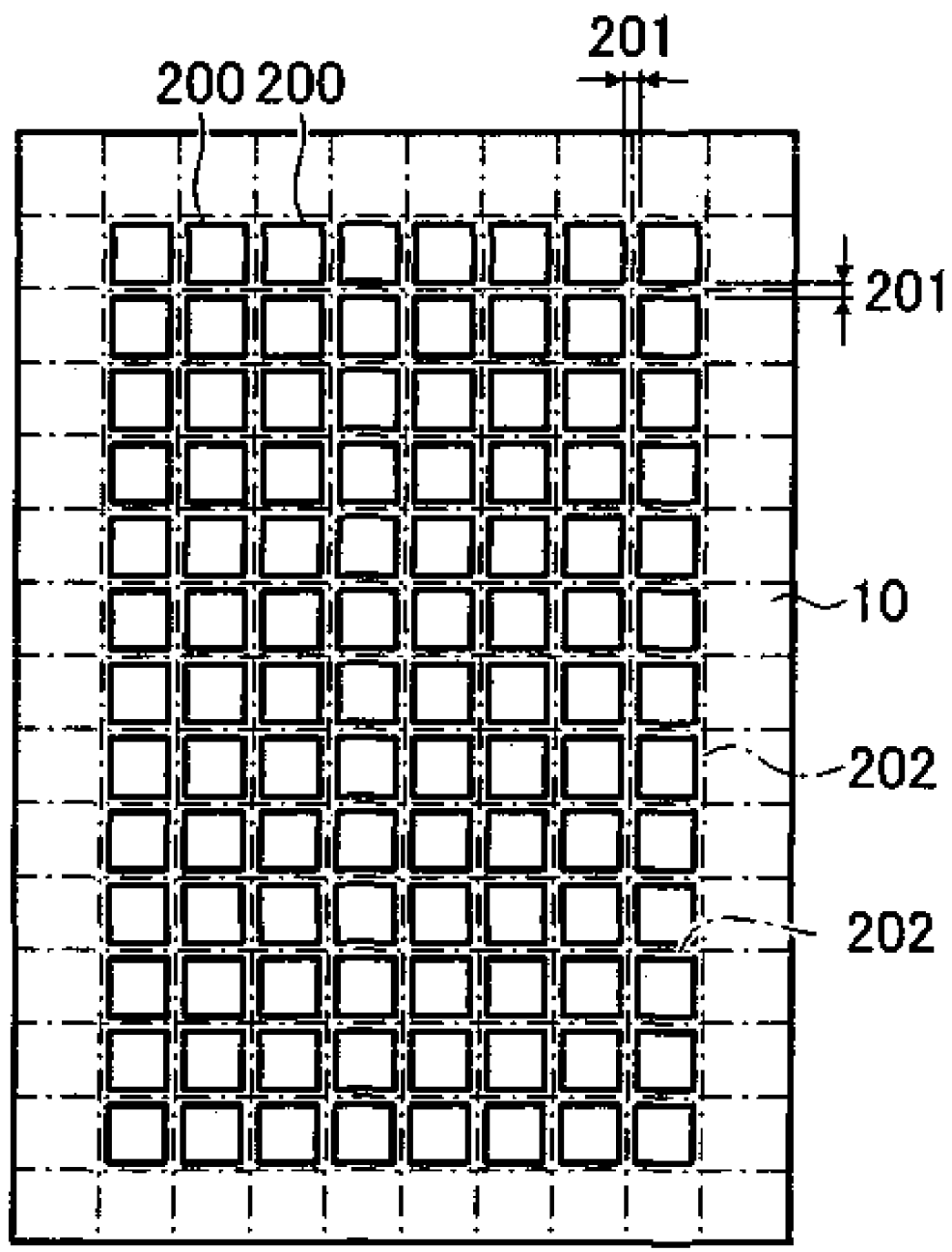

Such separation line pattern 202 may be further formed and extended to an edge of the substrate 10 as illustrated in FIG. 37. Accordingly, each electronic device 200 can be cut from the substrate 10 with higher precision.

Instead of providing the separation line pattern 202 on the substrate 10, a mechanical strength of an area on the substrate 10 corresponding to the separation line pattern 202 may be set small compared to other area of the substrate 10. For example, a plurality of holes may be perforated in a line shape between the electronic devices 200 on the substrate 10 so that each of the electronic devices 200 can be cut with a smaller force (e.g., hand force). Further, such mechanical strength can be set smaller by reducing a thickness of the substrate 10 between the electronic devices 200.

As above described, in an exemplary embodiment, a wiring pattern substrate or an electronic device substrate having a fine pattern, such as several μm to several ten μm (e.g., 1 μm to 50 μm), can be fabricated with an image forming apparatus using Carlson process or inkjet method instead of using a conventional photolithography.

Such image forming apparatus using inkjet method may have a jet head having nozzles of minute size to dispense a solution including electronic function material to a substrate to form a wiring pattern or an electronic device on a substrate. In case of an image forming apparatus using Carlson process, particles including electronic function material may be used to form a wiring pattern or an electronic device on a substrate.

Because such image forming apparatus has a relatively simplified configuration compared to a relatively expensive manufacturing equipment used for semiconductor manufacturing process, a wiring pattern or an electronic device can be formed on a substrate with a lower cost and reliable manner, which is preferable.

Further, such wiring pattern or electronic device can be formed on a substrate with other printing methods, such as transfer method using heat, offset lithography, relief printing, plate printing, and screen printing.

Numerous additional modifications and variations are possible in light of the above teachings. It is therefore to be understood that within the scope of the appended claims, the disclosure of the present invention may be practiced otherwise than as specifically described herein.

This disclosure claims priority from Japanese Patent Application Nos. 2006-314882, filed on Nov. 21, 2006 and 2007-213083, filed on Aug. 17, 2007 in the Japan Patent Office, the entire contents of which are hereby incorporated herein by reference.

What is claimed is:

1. A functional sheet formed with at least one of a wiring pattern and an electronic device, fabricated by a jet head that ejects a droplet of a liquid containing electronic function material onto the functional sheet, so as to form said at least one of the wiring pattern and electronic device, by a solid component that remains on the sheet when a volatile ingredient of the liquid vaporizes, said functional sheet comprising:

a sheet made of paper or paper-based material;

said at least one of the wiring pattern and electronic device being disposed at least on one face of the sheet, wherein said sheet has a density of paper of 0.40 g/cm$^3$ or greater and a stiffness not to be deformed by its own weight.

2. The functional sheet according to claim 1, wherein a face of the sheet is coated with a coating material to suppress a sheet concavity and convexity attributed to paper fibers, and said at least one of the wiring pattern and electronic device is disposed on said face of the sheet, applied with the coating material.

3. The functional sheet according to claim 1, wherein said at least one of the wiring pattern and electronic device includes a stripe pattern formed of a string of a plurality of dots, the dots are arranged in two respectively perpendicular directions, and the stripe pattern has a corner portion having a curved shape at a portion where the stripe pattern bends in any one of the two respectively perpendicular directions.

4. The functional sheet according to claim 1, wherein the wiring pattern is disposed on one face of the sheet, or the wiring pattern is disposed on both faces of the sheet.

5. The functional sheet according to claim 1, wherein the electronic device is disposed on one face of the sheet, or the electronic device is disposed on both faces of the sheet.

6. The functional sheet according to claim 1, wherein the wiring pattern is disposed on one face of the sheet and the electronic device is disposed on another face of the sheet.

7. The functional sheet according to claim 1, wherein the sheet has a plurality of areas on which are formed a plurality of electronic devices, each of the areas functioning as an electronic device, and the sheet also has a device separation region, wherein said electronic device is separated from said functional sheet at said device separation region.

8. The functional sheet according to claim 7, wherein said device separation region has a separation line.

9. The functional sheet according to claim 7, wherein a mechanical strength of said device separation region is smaller than that of other areas.

* * * * *